United States Patent
Fujikawa

(10) Patent No.: US 11,528,814 B2
(45) Date of Patent: Dec. 13, 2022

(54) ELECTROOPTICAL DEVICE AND ELECTRONIC APPARATUS

(71) Applicant: SEIKO EPSON CORPORATION, Tokyo (JP)

(72) Inventor: Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 267 days.

(21) Appl. No.: 16/808,488

(22) Filed: Mar. 4, 2020

(65) Prior Publication Data

US 2020/0288584 A1    Sep. 10, 2020

(30) Foreign Application Priority Data

Mar. 5, 2019    (JP) ............................. JP2019-039253

(51) Int. Cl.
*G02F 1/1345* (2006.01)
*H05K 5/00* (2006.01)
(Continued)

(52) U.S. Cl.
CPC ....... *H05K 5/0017* (2013.01); *G02F 1/13452* (2013.01); *G02F 1/136204* (2013.01);
(Continued)

(58) Field of Classification Search
CPC .......... G02F 1/13452; G02F 1/136204; G02F 1/136286
See application file for complete search history.

(56) References Cited

U.S. PATENT DOCUMENTS

| 6,407,796 B2* | 6/2002 | Tajima | ............... H01L 23/5387 |
| | | | 349/150 |
| 2007/0138654 A1* | 6/2007 | Kim | .................. H01L 23/49838 |
| | | | 257/786 |

(Continued)

FOREIGN PATENT DOCUMENTS

| JP | S60-107829 U | 7/1985 |
| JP | 2005-283830 A | 10/2005 |

(Continued)

OTHER PUBLICATIONS

KR 20180003243 A (Park Chang Ju et al.) (Year: 2018).*

*Primary Examiner* — James A Dudek
(74) *Attorney, Agent, or Firm* — Oliff PLC

(57) ABSTRACT

An electro-optical device includes a data line selection circuit positioned on a display region side, a first terminal group, a second terminal group, a first video signal line electrically connected to a first terminal of the first terminal group, and a second video line electrically connected to a second terminal of the second terminal group. The first video signal line includes a first portion extending from the first terminal toward the second terminal group, a second portion extending from the first portion in a direction intersecting the first portion, and a third portion extending from the second portion toward the data line selection circuit. The second video signal line includes a fourth portion extending from the second terminal toward the first terminal group, a fifth portion extending from the fourth portion along the second portion, and a sixth portion extending from the fifth portion toward the data line selection circuit.

6 Claims, 18 Drawing Sheets

(51) Int. Cl.
*H05K 1/02* (2006.01)
*G02F 1/1362* (2006.01)

(52) U.S. Cl.
CPC ....... *G02F 1/136286* (2013.01); *H05K 1/028* (2013.01); *H05K 1/0274* (2013.01); *H05K 2201/10128* (2013.01)

(56) References Cited

U.S. PATENT DOCUMENTS

| | | |
|---|---|---|
| 2018/0031937 A1 | 2/2018 | Takahashi et al. |
| 2018/0228018 A1 | 8/2018 | Yoshii |
| 2018/0228037 A1* | 8/2018 | Fujikawa ............ G02F 1/13452 |

FOREIGN PATENT DOCUMENTS

| | | |
|---|---|---|
| JP | 2008-083072 A | 4/2008 |
| JP | 2011-008051 A | 1/2011 |
| JP | 2015-106109 A | 6/2015 |
| JP | 2018-017789 A | 2/2018 |
| JP | 2018-128487 A | 8/2018 |
| JP | 2018-128498 A | 8/2018 |

* cited by examiner

ELECTROOPTICAL DEVICE AND ELECTRONIC APPARATUS

The present application is based on, and claims priority from JP Application Serial Number 2019-039253, filed Mar. 5, 2019, the disclosure of which is hereby incorporated by reference herein in its entirety.

BACKGROUND

1. Technical Field

The present application relates to an electro-optical device and an electronic apparatus provided with the electro-optical device.

2. Related Art

As an electro-optical device, an active drive-type electro-optical device is known that includes a transistor, which is a switching element, for each of a plurality of pixels. In order to increase display quality in such an electro-optical device, definition of the pixels is enhanced, and a number of the pixels in a display region is increased. Increasing the number of pixels also increases a number of terminals coupled to an external circuit in order to provide signals, such as video data, to the electro-optical device. As the number of terminals increases, an arrangement of wiring coupled to the terminals also becomes complicated. As a result, when the wiring coupled to the plurality of terminals has different electrical properties, there is a risk that the signals being transmitted through the wiring may be affected as a result of the different electrical properties, thereby causing display unevenness to arise.

As a technique for improving such display unevenness due to the different electrical properties of the wiring coupled to the terminals, for example, JP-A-2015-106109 discloses an electro-optical device that includes a first row of terminals to which first wiring is coupled, and a second row of terminals to which second wiring is coupled. The first row of terminals is disposed between a display region and one side of an outer periphery of a substrate, and the second row of terminals is disposed between the first row of terminals and the above-described one side of the outer periphery. The first wiring extends between the display region and the above-described one side of the outer periphery, and the second wiring extends between the display region and the second row of terminals. According to the electro-optical device disclosed in JP-A-2015-106109, a first wiring capacity of the first wiring and a second wiring capacity of the second wiring can be made substantially the same. In this way, a time constant of signal transmission in the first wiring and a time constant of signal transmission in the second wiring are substantially the same, and thus, display unevenness due to differences in the time constant of the wiring can be suppressed.

Further, for example, JP-A-2018-017789 discloses an electro-optical device that is provided with a pixel area including a first pixel and a second pixel, a first terminal, a second terminal positioned at a side opposite to the pixel area so as to interpose the first terminal therebetween, first wiring that extends from the first terminal and is included in a route for transmitting a first signal to the first pixel, and second wiring that extends from the second terminal and is included in a route for transmitting a second signal to the second pixel. A difference in resistance between the route transmitting the first signal and the route transmitting the second signal is made smaller than a difference in resistance caused by a difference between lengths of the first wiring and the second wiring. More specifically, an example is illustrated in which the second wiring is wider than the first wiring. According to the electro-optical device disclosed in JP-A-2018-017789, a deterioration in display quality due to differences in the length of wiring extending from each of the plurality of terminals can be suppressed.

In the above-described electro-optical device disclosed in JP-A-2015-106109, since the length of the first wiring from the first row of terminals to the display region differs from the length of the second wiring from the second row of terminals to the display region, there is a risk that display quality may deteriorate due to the differences in the length of the wiring. Therefore, it is conceivable to make an improvement by applying the configuration illustrated in JP-A-2018-017789 to the above-described electro-optical apparatus disclosed in JP-A-2015-106109, but, in each of the wiring coupled to the plurality of terminals, individually adjusting the width of the wiring increases design constraints, given a relative arrangement of the plurality of terminals with respect to the pixel area, the type of signal transmitted, and the like. In other words, there is a problem in that it is desired to make the design of the wiring as simple as possible while suppressing the deterioration in display quality due to the difference in the electrical properties of the wiring coupled to the plurality of terminals.

SUMMARY

The electro-optical device according to the present application includes a display region, a first terminal group including a first terminal, a second terminal group including a second terminal disposed on an opposite side of the display region from the first terminal, a first video signal line electrically connected to the first terminal and a second video signal line electrically connected to the second terminal. The first video signal line includes a first portion extending from the first terminal toward the second terminal group, a second portion extending from the first portion in a direction intersecting the first portion, and a third portion extending from the second portion toward the display region, and the second video signal line includes a fourth portion extending from the second terminal toward the first terminal group, a fifth portion extending from the fourth portion along the second portion of the first video signal line, and a sixth portion extending from the fifth portion toward the display region along the third portion of the first video signal line.

Further, another electro-optical device according to the present application includes a display region, a first terminal group including a first terminal, a second terminal group including a second terminal disposed on an opposite side of the display region from the first terminal, a first video signal line electrically connected to the first terminal, and a second video signal line electrically connected to the second terminal. The first video signal line includes a first portion extending from the first terminal toward the second terminal group, a second portion extending from the first portion in a direction intersecting the first portion, and a third portion extending from the second portion toward the display region, and the second video signal line includes a fourth portion extending from the second terminal toward the first terminal group, a fifth portion extending from the fourth portion in an opposite direction to the second portion of the first video signal line, and a sixth portion extending from the fifth portion toward the display region along the third portion of the first video signal line.

In the electro-optical device described above, the third portion of the first video signal line and the sixth portion of the second video signal line are preferably disposed between the first terminal of the first terminal group and another terminal adjacent to the first terminal.

In the electro-optical device described above, the third portion of the first video signal line preferably extends along one side of the first terminal, and the sixth portion of the second video signal line is preferably disposed along another side of the first terminal opposite to the one side.

The electro-optical device described above preferably further includes a first extending portion extending from the third portion of the first video signal line to a side opposite to the display region, and a second extending portion extending from the sixth portion of the second video signal line to the side opposite to the display region.

The electro-optical device described above preferable further includes a first electrostatic protection circuit electrically connected to the first portion of the first video signal line, and a second electrostatic protection circuit electrically connected to the fourth portion of the second video signal line.

An electronic apparatus according to the present application includes the electro-optical device described above.

DESCRIPTION OF EXEMPLARY EMBODIMENTS

Exemplary embodiments of the present disclosure are described below with reference to the accompanying drawings. Note that, in the following drawings, parts described are illustrated in an enlarged or reduced state as appropriate, so that the parts can be recognized.

1. Embodiment 1

1-1. Electro-Optical Device

An example of an electro-optical device of this embodiment is an active drive-type liquid crystal device. This liquid crystal device is a micro display used as a light modulating unit of a projection-type display device that is an electronic apparatus to be described later.

Figure 1:
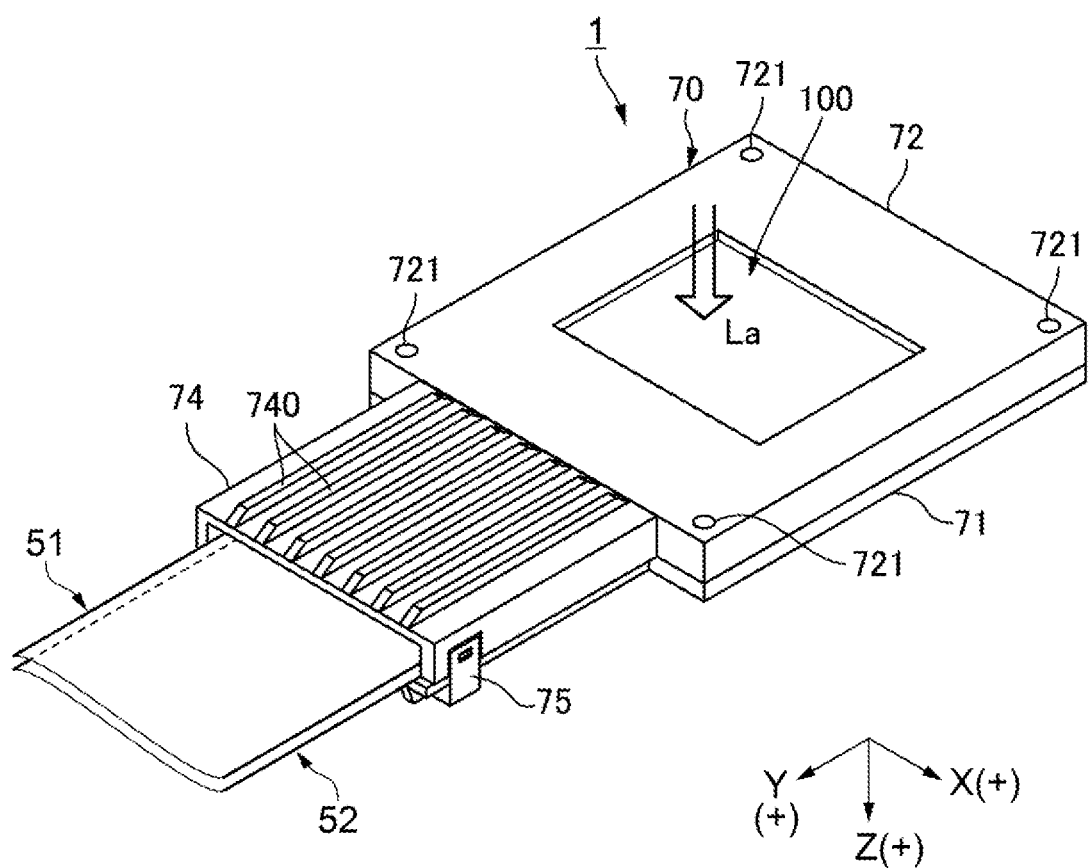
FIG. 1 is a perspective view illustrating a liquid crystal device as an electro-optical device according to Embodiment 1.
Figure 2:
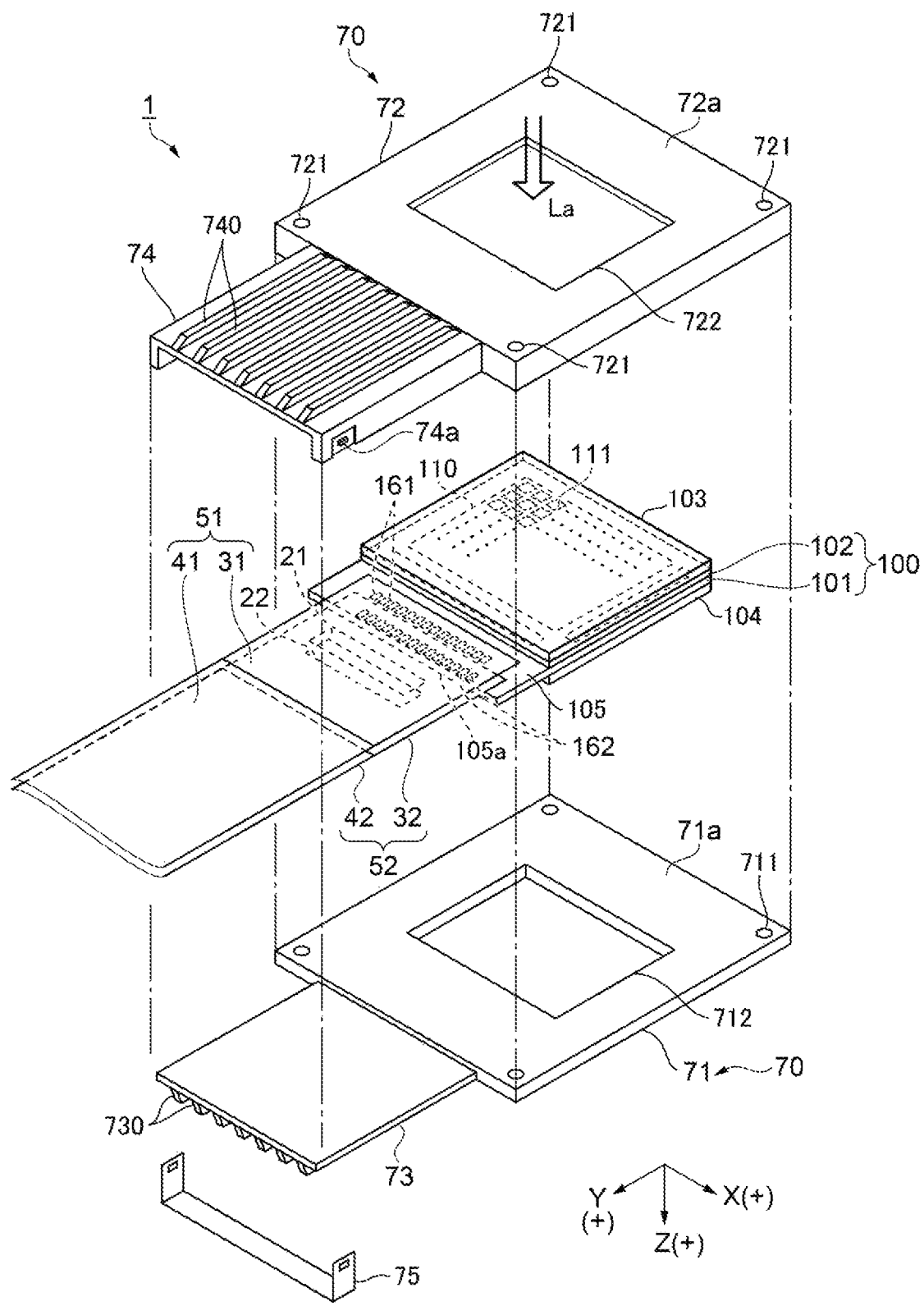
FIG. 2 is an exploded perspective view illustrating a configuration of the liquid crystal device as the electro-optical device according to Embodiment 1.

FIG. 1 is a perspective view illustrating a configuration of a liquid crystal device as an electro-optical device according to Embodiment 1, and FIG. 2 is an exploded perspective view illustrating the configuration of the liquid crystal device as the electro-optical device according to Embodiment 1.

As illustrated in FIG. 1, a liquid crystal device 1 as the electro-optical device of this embodiment is provided with a liquid crystal panel 100 as an electro-optical panel, a first mounting substrate 51 and a second mounting substrate 52 electrically coupled to the liquid crystal panel 100, and a frame-shaped holder 70 that sandwiches and holds the liquid crystal panel 100. The holder 70 is configured by a first holder member 71 and a second holder member 72 formed, for example, using a metal such as aluminum, or an alloy.

Hereinafter, a direction along one side of the liquid crystal panel 100 is referred to as an X direction, a direction along another side intersecting the one side is referred to as a Y direction, and a direction of travel of light La incident on the liquid crystal panel 100 is referred to as a Z direction. The X direction and the Y direction are orthogonal to each other. The Z direction is orthogonal to the X direction and the Y direction. Further, a view taken along the Z direction is referred to as "plan view".

The first mounting substrate 51 and the second mounting substrate 52 that are electrically coupled to the liquid crystal panel 100 protrude from the holder 70 in the positive Y direction, and are electrically coupled to an external circuit (not illustrated).

As illustrated in FIG. 2, the liquid crystal panel 100 of this embodiment is a transmission-type, is configured, for example, using a light-transmitting substrate, such as a quartz substrate or the like, and includes an element substrate 101 and a counter substrate 102 arranged facing each other, and a liquid crystal layer sandwiched between this pair of substrates. The counter substrate 102 is disposed on a side of the element substrate 101 on which the light La is incident. The liquid crystal panel 100 includes a plurality of pixels 111 arranged in a matrix in the positive X direction and the positive Y direction. A display region 110 is a region in which the plurality of pixels 111 are arranged in the matrix. Note that the display region 110 may also include a plurality of dummy pixels that do not contribute to the display.

A first dust-resistant substrate 103 is disposed on a side of the counter substrate 102 on which the light La is incident, and a second dust-resistant substrate 104 is disposed on a side of the counter substrate 102 on which the incident light La is modulated and emitted from the element substrate 101 as display light. The first dust-resistant substrate 103 and the second dust-resistant substrate 104 are provided such that the liquid crystal panel 100 is less susceptible to the influence of attached foreign material when the display of the liquid crystal panel 100 is magnified and projected. Taking into account dimensional changes due to thermal expansion and contraction, a light-transmitting substrate such as a quartz substrate, for example, is used for the first dust-resistant substrate 103 and the second dust-resistant substrate 104, similarly to the element substrate 101 and the counter substrate 102.

A portion of the element substrate 101 protruding in the positive Y direction from the counter substrate 102 of the liquid crystal panel 100 is a terminal portion 105. A first terminal group 161 and a second terminal group 162 for external connection are provided on the terminal portion 105, in that order, from the display region 110 side in the positive Y direction, with an interval therebetween. The first terminal group 161 and the second terminal group 162 each includes a plurality of terminals arrayed at a predetermined pitch in the positive X direction. The second terminal group 162 is disposed along one side 105a of the terminal portion 105 that is one side of the element substrate 101, and the first terminal group 161 is disposed between the second terminal group 162 and the display region 110. A detailed configuration of the terminal portion 105 in which the first terminal group 161 and the second terminal group 162 are disposed will be described later.

The first mounting substrate 51 includes a first flexible wiring substrate 31 on which a first driver IC 21 is mounted, and a first extension substrate 41 electrically coupled to the first flexible wiring substrate 31. Similarly, the second mounting substrate 52 includes a second flexible wiring substrate 32 on which a second driver IC 22 is mounted, and a second extension substrate 42 electrically coupled to the second flexible wiring substrate 32.

The first flexible wiring substrate 31 is electrically coupled to the first terminal group 161 provided on the terminal portion 105 of the liquid crystal panel 100. Similarly, the second flexible wiring substrate 32 is electrically coupled to the second terminal group 162 provided on the terminal portion 105 of the liquid crystal panel 100. In the terminal portion 105 of the liquid crystal panel 100, the first flexible wiring substrate 31 is mounted so as to be overlapped with respect to the second flexible wiring substrate 32 in the negative Z direction.

The first holder member 71 configuring the holder 70 has a rectangular main body 71a and a plate-like first heat dissipation portion 73 protruding in the positive Y direction from the main body 71a. A plurality of heat dissipation fins 730, which extend along the positive Y direction and are arrayed at predetermined intervals in the positive X direction, are provided on the positive Z direction side of the first heat dissipation portion 73. The main body 71a is provided with a rectangular opening 712 in a portion corresponding to the display region 110 of the liquid crystal panel 100. Holes 711 are provided in each of the four corners of the main body 71a.

The second holder member 72 also configuring the holder 70 has a rectangular main body 72a and a gate-like second heat dissipation portion 74 protruding in the positive Y direction from the main body 72a A plurality of heat dissipation fins 740, which extend along the positive Y direction and are arrayed at predetermined intervals in the positive X direction, are provided on the negative Z direction side of the second heat dissipation portion 74. The main body 72a is provided with a rectangular opening 722 in a portion corresponding to the display region 110 of the liquid crystal panel 100. Holes 721 are provided in each of the four corners of the main body 72a. The positive Z direction side of the second holder member 72 forms a concave portion.

In other words, the liquid crystal panel 100 to which the first dust-resistant substrate 103 and the second dust-resistant substrate 104 are adhered is housed in the concave portion of the second holder member 72 and is sandwiched with the first holder member 71 serving as a lid. The main body 71a of the first holder member 71 and the main body 72a of the second holder member 72 are fixed by screws, for example, by inserting bolts into the holes 711 and 721 provided in the four corners. Further, the first heat dissipation portion 73 is fixed to the second heat dissipation portion 74 using a fixing member 75, in a state in which the first mounting substrate 51 and the second mounting substrate 52 are sandwiched between the first heat dissipation portion 73 and the second heat dissipation portion 74. Engaging portions 74a with which the fixing member 75 is detachably engaged are provided in a side surface on the positive X direction side and in a side surface on the negative X direction side of the second heat dissipation portion 74.

Note that in this embodiment, the liquid crystal device 1 including the holder 70 is an example of the electro-optical device, but the holder 70 is not an essential configuration in the electro-optical device.

Figure 3:
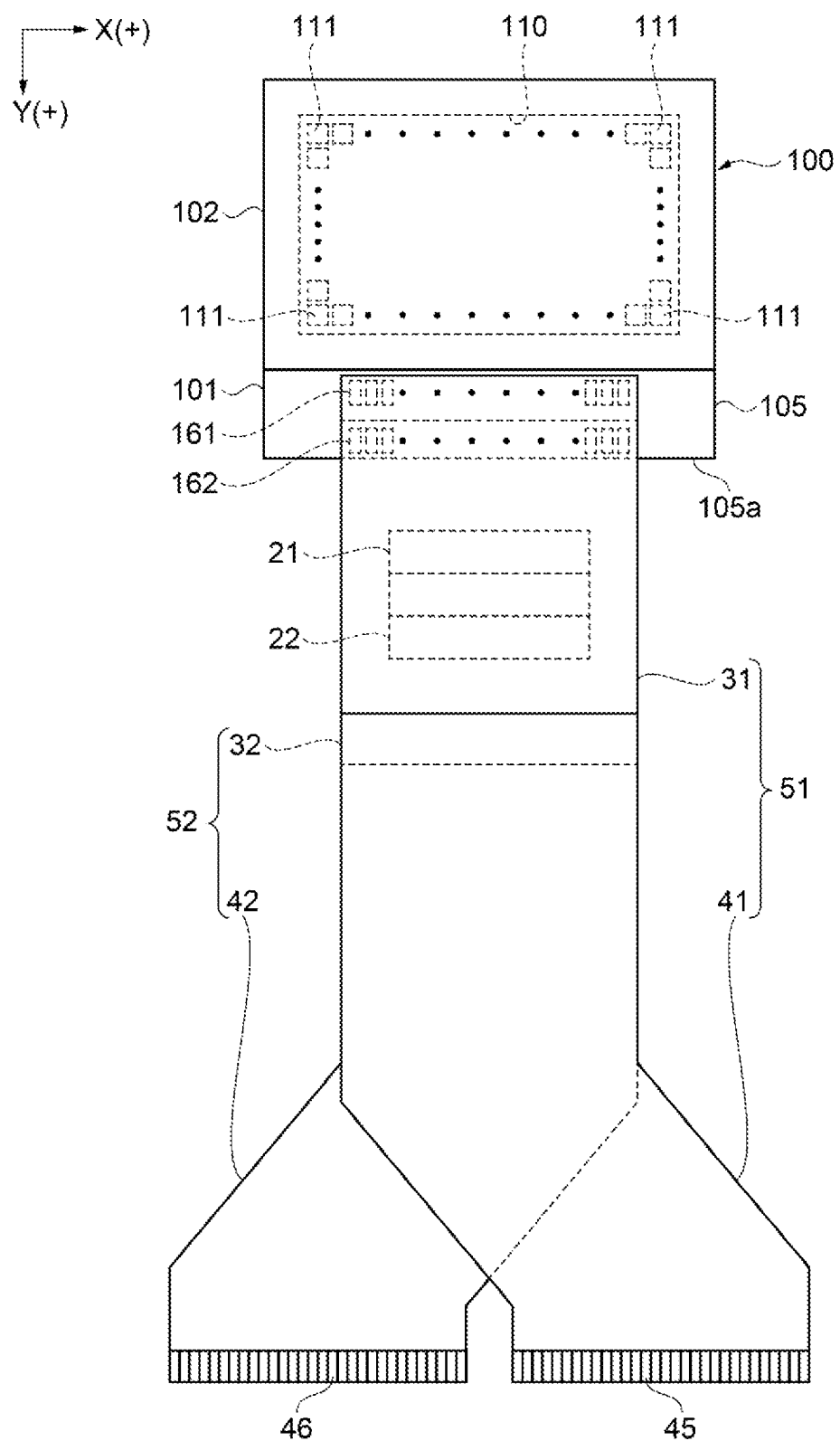
FIG. 3 is a plan view illustrating a liquid crystal panel in which a first mounting substrate and a second mounting substrate according to Embodiment 1 are electrically coupled.
Figure 4:
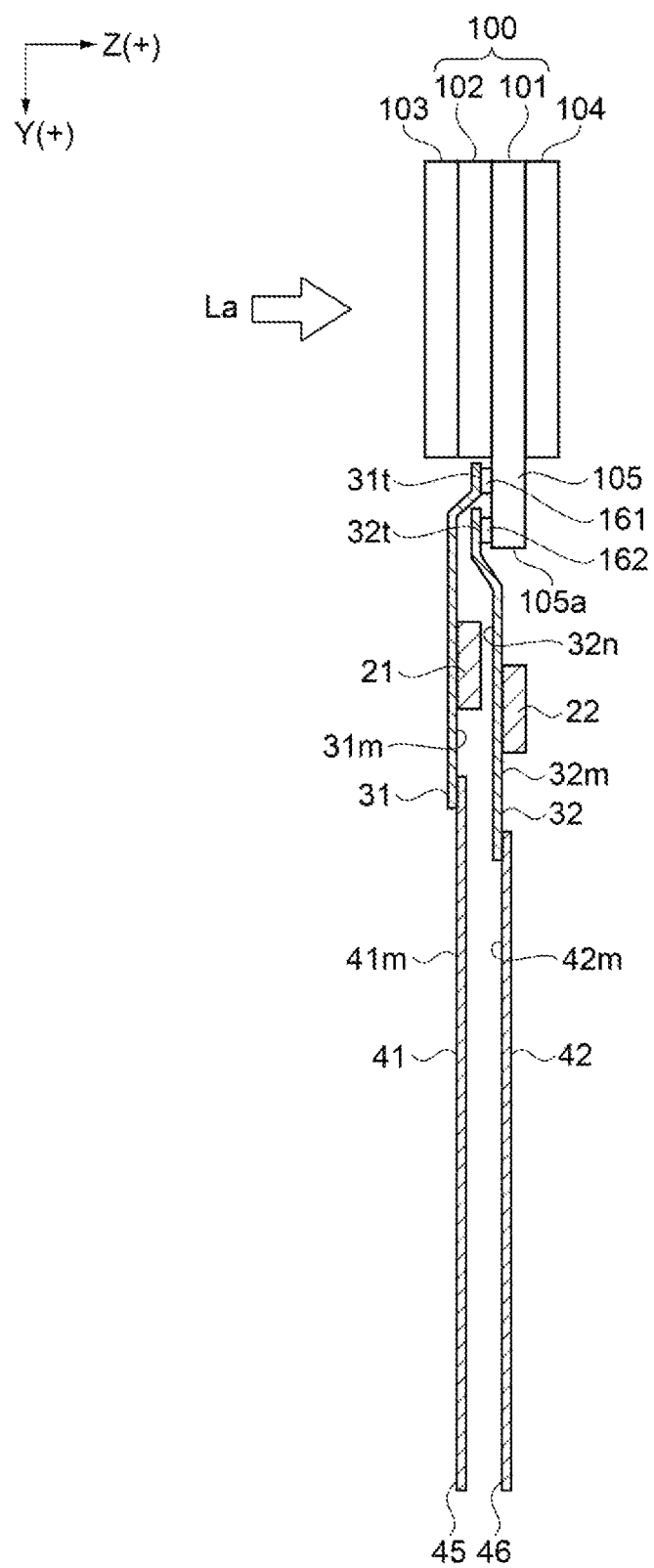
FIG. 4 is a side view illustrating the liquid crystal panel in which the first mounting substrate and the second mounting substrate are electrically coupled.

FIG. 3 is a plan view illustrating the liquid crystal panel in which the first mounting substrate and the second mounting substrate of Embodiment 1 are electrically coupled, and FIG. 4 is a side view illustrating the liquid crystal panel in which the first mounting substrate and the second mounting substrate are electrically coupled. As illustrated in FIG. 3, the liquid crystal panel 100 includes, in the display region 110, the plurality of pixels 111 arranged in the matrix in the positive X direction that is a row direction and in the positive Y direction that is a column direction. The liquid crystal panel 100 is an active drive-type liquid crystal panel, and each of the pixels 111 is provided with a pixel electrode (not illustrated), a switching element (not illustrated) for performing switching control of the pixel electrode, a counter electrode (not illustrated) facing the pixel electrode with a liquid crystal layer interposed therebetween, and a retention capacitor. The pixel electrode, the switching element, and the retention capacitor are formed on the element substrate 101. The switching element is, for example, a thin film transistor (TFT). The counter electrodes are formed on the counter substrate 102 at least across the display region 110 so as to face the plurality of pixel electrodes. The pixel electrodes and the counter electrodes are formed using a transparent conductive film such as ITO or IZO, for example.

The first terminal group 161 and the second terminal group 162 are provided on the terminal portion 105 of the element substrate 101. The first flexible wiring substrate 31 of the first mounting substrate 51 is electrically coupled to the first terminal group 161. The second flexible wiring substrate 32 of the second mounting substrate 52 is electrically coupled to the second terminal group 162. An end portion, in the positive Y direction, of the first extension substrate 41 electrically coupled to the first flexible wiring substrate 31 bends in the positive X direction. In contrast, an end portion, in the positive Y direction, of the second extension substrate 42 electrically coupled to the second flexible wiring substrate 32 bends in the negative X direction. A first input terminal 45 is provided on the positive Y direction end portion of the first extension substrate 41. A second input terminal 46 is provided on the positive Y direction end portion of the second extension substrate 42. In plan view, the second input terminal 46 and the first input terminal 45 are aligned in a straight line in the positive X direction. According to the first mounting substrate 51 and the second mounting substrate 52 configured as described above, the first input terminal 45 of the first extension substrate 41 can be coupled to one conductive connector, of two conductive connectors horizontally installed in an external printed wired board, and the second input terminal 46 of the second extension substrate 42 can be coupled to the other conductive connector. In other words, a configuration is adopted in which the second extension substrate does not get in the way when coupling the first extension substrate 41 to the one conductive connector. Note that the shape of the first extension substrate 41 and the second extension substrate 42 is not limited to being bent, and may be a straight shape.

As illustrated in FIG. 4, the first driver IC 21 is mounted on a first substrate surface 31m of the first flexible wiring substrate 31. A coupling terminal group 31t is provided on an end portion of the first substrate surface 31m of the first flexible wiring substrate 31. A second driver IC 22 is mounted on a first substrate surface 32m of the second flexible wiring substrate 32. A coupling terminal group 32t is provided on an end portion of the first substrate surface 32m of the second flexible wiring substrate 32. In other words, in this embodiment, the first flexible wiring substrate 31 and the second flexible wiring substrate 32 are both flexible single-sided wiring substrates.

The first terminal group 161 and the second terminal group 162 are provided in this order in the positive Y direction on the terminal portion 105, of the element substrate 101, that protrudes from the counter substrate 102 in the positive Y direction. The first terminal group 161 and the coupling terminal group 31t of the first flexible wiring substrate 31 are electrically coupled via an anisotropic conductive film (ACF), for example. The second terminal group 162 and the coupling terminal group 32t of the second flexible wiring substrate 32 are also electrically coupled via an ACF, for example.

The first flexible wiring substrate 31 is mounted on the terminal portion 105 of the element substrate 101 so as to overlap in the negative Z direction with the second flexible wiring substrate 32 mounted in advance. Further, the second flexible wiring substrate 32 is mounted on the terminal portion 105 so as to be offset in the positive Y direction with respect to the first flexible wiring substrate 31, in correspondence with the arrangement of the second terminal group 162 on the terminal portion 105. Accordingly, in a state in which the first flexible wiring substrate 31 and the second flexible wiring substrate 32 are mounted on the terminal portion 105 of the element substrate 101, a second substrate surface 32n of the second flexible wiring substrate 32 and the first substrate surface 31m of the first flexible wiring substrate 31 are in a state of facing each other.

The first extension substrate 41 and the second extension substrate 42 are also flexible single-sided wiring substrates. On a first substrate surface 41m of the first extension substrate 41, the first input terminal 45 is provided at an end portion in the positive Y direction and a coupling terminal (not illustrated) is provided at an end portion in the negative Y direction. Similarly, on a first substrate surface 42m of the second extension substrate 42, the second input terminal 46 is provided at an end portion in the positive Y direction and a coupling terminal (not illustrated) is provided at an end portion in the negative Y direction. The first extension substrate 41 is electrically coupled to the first flexible wiring substrate 31 via the coupling terminal provided at the end portion in the negative Y direction. The second extension substrate 42 is electrically coupled to the second flexible wiring substrate 32 via the coupling terminal provided at the end portion in the negative Y direction.

Although not illustrated in FIG. 4, a plurality of wiring lines, and a resist layer or a cover lay, for example, covering the plurality of wiring lines are provided on the first substrate surface 31m of the first flexible wiring substrate 31. Similarly, a plurality of wiring lines, and a resist layer or a cover lay, for example, covering the plurality of wiring lines are provided on the first substrate surface 32m of the second flexible wiring substrate 32. In each of the first extension substrate 41 and the second extension substrate 42, a plurality of wiring lines, and a resist layer or a cover lay, for example, covering the plurality of wiring lines are provided.

Further, although not illustrated in FIG. 4, the first driver IC 21 is a bare chip, and is mounted on the first flexible wiring substrate 31 in a state in which the outer periphery of the first driver IC 21 is molded. The second driver IC 22 is also a bare chip, and is mounted on the second flexible wiring substrate 32 in a state in which the outer periphery of the second driver IC 22 is molded. Further, in the terminal portion 105, in order to secure coupling reliability between the first terminal group 161 and the coupling terminal group 31t and coupling reliability between the second terminal group 162 and the coupling terminal group 32t, a portion of the terminal portion 105 on which the first flexible wiring substrate 31 and the second flexible wiring substrate 32 are mounted is preferably sealed (molded) using a mold material having insulating properties. Note that electronic components other than the first driver IC 21, such as chip resistors, chip condensers, and the like may also be mounted on the first flexible wiring substrate 31. Similarly, electronic components other than the second driver IC 22 may also be mounted on the second flexible wiring substrate 32.

1-2. Electrical Configuration of Liquid Crystal Device

Figure 5:
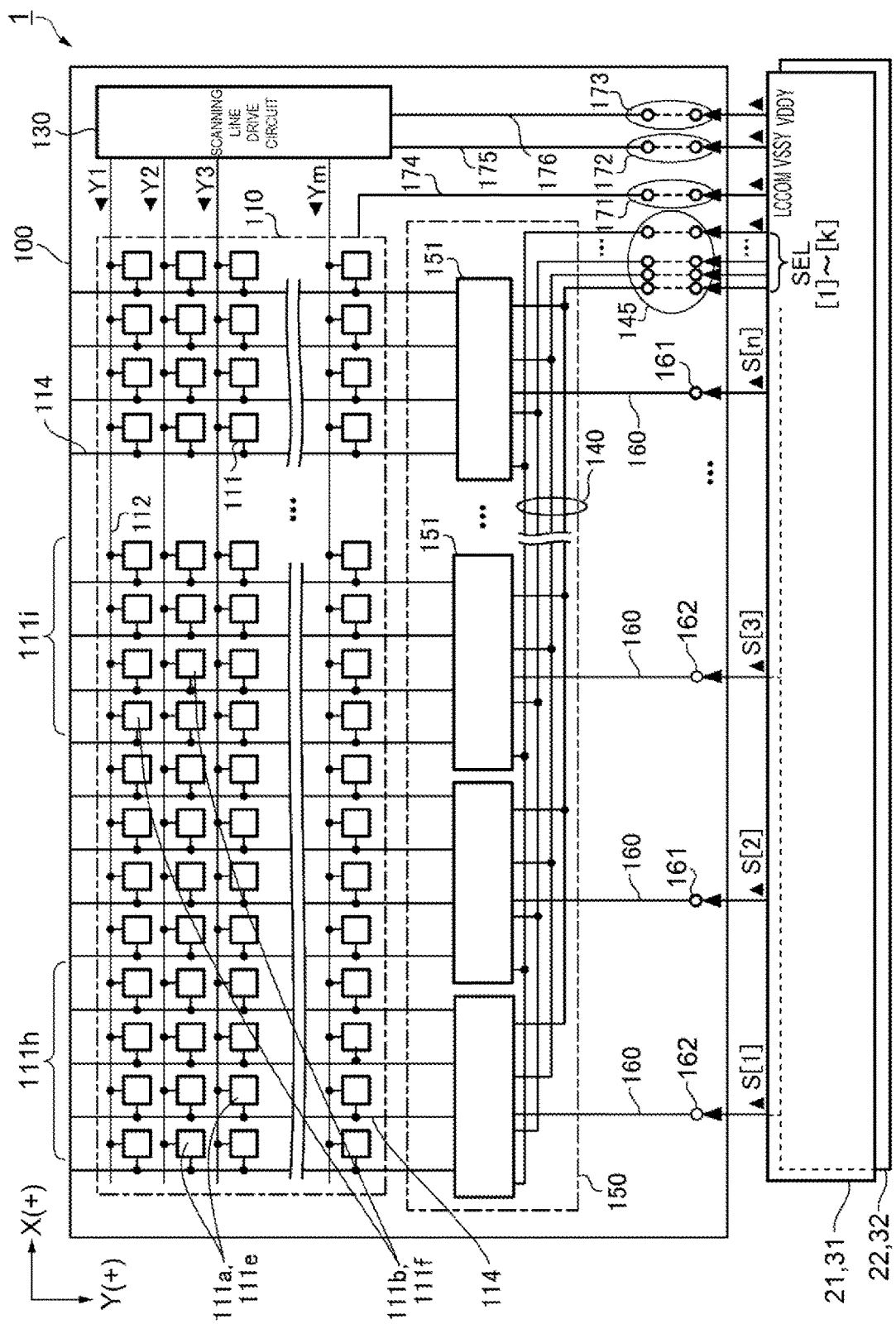
FIG. 5 is a circuit diagram illustrating an electrical configuration of the liquid crystal device as the electro-optical device according to Embodiment 1.

FIG. 5 is a circuit diagram illustrating an electrical configuration of the liquid crystal device as the electro-optical device.

As illustrated in FIG. 5, the liquid crystal panel 100 of the liquid crystal device 1 as the electro-optical device according to this embodiment includes the display region 110, a scanning line drive circuit 130, a data line selection circuit 150 (a selection circuit), n number of video signal lines 160, n number of video signal input terminals (the first terminal group 161 and the second terminal group 162), k number of selection signal lines 140, k number of selection signal input terminals 145, a plurality of power source terminals 171, 172, and 173, and power source lines 174, 175, and 176 corresponding to the power source terminals 171, 172, and 173. n is an integer equal to or greater than 1, and k is an integer equal to or greater than 2. In this embodiment, as illustrated in FIG. 5, there are four of the selection signal lines 140 and k is 4, but the present disclosure is not limited thereto. These structural elements are formed on the element substrate 101 illustrated in FIG. 2. In the element substrate 101, the data line selection circuit 150 is formed between the display region 110 and the first terminal group 161 and the second terminal group 162, along the positive X direction, and the scanning line drive circuit 130 is formed along the positive Y direction between the display region 110 and another side intersecting the side on which the data line selection circuit 150 is formed.

In accordance with clock signals, control signals, video data, and the like input to the liquid crystal panel 100 from an external upper circuit (not illustrated) via the first extension substrate 41 and the second extension substrate 42 (see FIG. 4), the first driver IC 21 mounted on the first flexible wiring substrate 31 and the second driver IC 22 mounted on the second flexible wiring substrate 32 output video signals, control signals, and the like representing video to be displayed on the liquid crystal panel 100. The liquid crystal panel 100 displays the video on the basis of the clock signals and video signals input from the first driver IC 21 and the second driver IC 22. The first driver IC 21 and the second driver IC 22 have the same configuration and output the same signals other than the video signals. Where necessary, signals related to some driving may be different depending on the specification of the first driver IC 21 and the second driver IC 22.

m number of the scanning lines 112, (k×n) number of the data lines 114, and (m×k×n) number of the pixels 111 are provided in the display region 110. m is an integer equal to or greater than 1. The pixels 111 are provided corresponding to intersections of the scanning lines 112 and the data lines 114, and are arranged in a matrix shape of m number of rows×(k×n) number of columns. The scanning lines 112 are signal lines that transmit scanning signals Y1, Y2, Y3, to Ym, and are provided from the scanning line drive circuit 130 along the X direction that is the row direction. The data lines 114 are signal lines that transmit data signals, and are provided from the data line selection circuit 150 along the Y direction that is the column direction.

In the display region 110, the k×m number of pixels 111 corresponding to the k number (columns) of data lines 114 form one pixel group (block). For example, a first pixel group 111h is provided in which a plurality (k columns) of first pixel rows 111e are arrayed along the X direction, each of the first pixel rows 111e including a plurality (m number) of first pixels 111a arrayed in the Y direction, and a second pixel group 111i is provided in which a plurality (k columns) of second pixel rows 111f are arrayed in the X direction, each of the second pixel rows 111f including a plurality (m number) of second pixels 111b arrayed in the Y direction. Here, the pixels 111 belonging to the same pixel group are coupled to the same video signal line 160 via the data line selection circuit 150. Thus, the liquid crystal panel 100 includes n number (columns) of pixel groups divided into n number of blocks by the n number (columns) of video signal lines 160 or the n number of video signal input terminals (the first terminal group 161 and the second terminal group 162).

The scanning line drive circuit 130 selects a row for writing in data from among the plurality of pixels 111 arranged in the matrix. Specifically, the scanning line drive circuit 130 outputs a scanning signal for selecting one of the scanning lines 112 from among the plurality of scanning lines 112. The scanning line drive circuit 130 supplies the scanning signals Y1, Y2, Y3, to Ym to the scanning lines 112 in the first, second, third to m-th rows. The scanning signals Y1, Y2, Y3 to Ym are, for example, signals that sequentially become a high level in an exclusive manner.

In each of the pixel groups, the data line selection circuit 150 selects a column (a pixel column) of the pixels 111 for writing the video signal. Specifically, the data line selection circuit 150 selects at least one of the data lines 114 from among the k number of data lines 114 belonging to the pixel group, in accordance with selection signals SEL [1] to SEL [k]. The data lines 114 are coupled in units of k, by the data line selection circuit 150, to one of the video signal lines 160, one at a time. In this embodiment, the data line selection circuit 150 includes n number of demultiplexers 151 corresponding each of then number of pixel groups.

The video signal lines 160 couple the video signal input terminals (the first terminal group 161 and the second terminal group 162) and the data line selection circuit 150. The video signal lines 160 are signal lines that transmit, to the data line selection circuit 150, video signals S (S[1] to S[n]) input from the first flexible wiring substrate 31 and the second flexible wiring substrate 32 via the video signal input terminals (the first terminal group 161 and the second terminal group 162), and n columns (number) of the video signal lines 160 are provided corresponding to the n number of video signal input terminals (the first terminal group 161 and the second terminal group 162) or each of the n number of pixel groups. The video signal S is a signal indicating data to be written into the pixel 111. Here, "video" refers to a still image or a moving image. A single one of the video signal lines 160 is coupled to the k number of data lines 114 via the data line selection circuit 150. Thus, in the video signal S, data supplied to the k number of data lines 114 is provided through time-division multiplexing.

The selection signal lines 140 electrically couple the selection signal input terminals 145 and the demultiplexers 151 of the data line selection circuit 150. The selection signal lines 140 (140[1] to 140[k]) are signal lines that transmit the selection signals SEL (SEL[1] to SEL[k]) input from the selection signal input terminals 145 (145[1] to 145[k]), and the k number of selection signal lines 140 are provided. The selection signals SEL are signals that sequentially become the high level.

The video signal input terminals (the first terminal group 161 and the second terminal group 162) are terminals to which the first flexible wiring substrate 31 and the second flexible wiring substrate 32 are electrically coupled, and a video signal S[j] is supplied to the video signal input terminals (j is an integer satisfying 1≤j≤n). In this example, a video signal S[2t] is supplied from the first driver IC 21 to the video signal input terminals (the first terminal group 161) corresponding to the video signal lines 160 of even columns, namely, of a second column, a fourth column, a sixth column to a (2t)-th column. A video signal S[2t−1] is supplied from the second driver IC 22 to the video signal input terminals (the second terminal group 162) corresponding to the video signal lines 160 of odd columns, namely a first column, a third column, a fifth column to a (2t−1)-th column, (t is an integer of 1≤t≤n/2). Further, the video signal S is a so-called data signal, and the video signal input terminals (the first terminal group 161 and the second terminal group 162) are supplied with analog signals having different waveforms in accordance with the display of the video.

The selection signal input terminal 145 is a terminal that is electrically coupled to the first flexible wiring substrate 31 and the second flexible wiring substrate 32, and the selection signal SEL formed of a pulse signal is supplied to the select signal input terminal 145. The selection signal SEL is a timing signal for selecting the data line 114 in the data line selection circuit 150. The selection signal input terminals 145 include terminals to which the first flexible wiring substrate 31 is electrically coupled, and terminals to which the second flexible wiring substrate 32 is coupled, and the selection signal SEL is supplied from both the first driver IC 21 of the first flexible wiring substrate 31 and the second driver IC 22 of the second flexible wiring substrate 32, or from one of the first driver IC 21 or the second driver IC 22. In this embodiment, the selection signals SEL having the same waveform are supplied to the selection signal input terminals 145 corresponding to each of the first flexible wiring substrate 31 and the second flexible wiring substrate 32. Accordingly, of the selection signal input terminals 145, the terminals to which the first flexible wiring substrate 31 is electrically coupled and the terminals to which the second flexible wiring substrate 32 is coupled are illustrated without making any differentiation therebetween, but the terminals to which the first flexible wiring substrate 31 is coupled and the terminals to which the second flexible wiring substrate 32 is coupled may be differentiated into the first terminal group 161 and the second terminal group 162.

The power source terminal 171, the power source terminal 172, and the power source terminal 173 are terminals that are electrically coupled to the first flexible wiring substrate 31 and the second flexible wiring substrate 32, and a power source voltage is supplied from the upper circuit via the first flexible wiring substrate 31 and the second flexible wiring substrate 32 without passing through the first driver IC 21 and the second driver IC 22. The power source voltage is a voltage used as a power source in the liquid crystal panel 100, and in this example is a DC voltage. The power source terminal 171 is a terminal for supplying a common voltage LCCOM, the power source terminal 172 is a terminal for supplying a reference voltage VSSY, and the power source terminal 173 is a terminal for supplying a drive voltage VDDY. The common voltage LCCOM is a voltage that serves as a reference potential of the voltage applied to the liquid crystal layer. The reference voltage VSSY is a voltage that becomes the power supply potential on the low-voltage side of the scanning line drive circuit 130. The drive voltage VDDY is a voltage that becomes the power supply potential on the high-voltage side of the scanning line drive circuit 130. The power source terminals 171, 172, and 173 are illustrated without differentiating the terminal to which the first flexible wiring substrate 31 is electrically coupled and the terminal to which the second flexible wiring substrate 32 is electrically coupled, but the terminal to which the first flexible wiring substrate 31 is electrically coupled and the terminal to which the second flexible wiring substrate 32 is electrically coupled may be differentiated into the first terminal group 161 and the second terminal group 162.

In this embodiment, only the one scanning line drive circuit 130 is provided in the element substrate 101, and thus, the power source terminals 172 and 173 are provided on only one side in the positive X direction. Note that the arrangement of the scanning line drive circuit 130 is not limited to this example, and the scanning line drive circuits 130 may be provided on both sides of the display region 110 in the X direction. In this case, the power source terminals 171, 172, and 173 are respectively provided on both sides in the X direction of the element substrate 101.

In this embodiment, data written into the pixels 111 in the [k×j−k+1] to [k×j] columns of the corresponding pixel groups are time-division multiplexed in the video signal S[j]. Further, when S[j] is the odd-numbered S[2$t$−1], the data is supplied to the data lines 114 of the odd-numbered pixel groups from the second driver IC 22. Further, when S[j] is the even-numbered S[2$t$], the data is supplied to the data lines 114 of the even-numbered pixel groups from the first driver IC 21. According to such a configuration, the two driver ICs, namely, the first driver IC 21 and the second driver IC 22, are used. Thus, the data can be written into twice the number of pixels 111 in one cycle, compared to a case in which only the one driver IC is used. Then, as described above, the first terminal group 161 and the second terminal group 162 are arranged to achieve the high-resolution and high quality small liquid crystal device 1. Note that the coupling between the first terminal group 161 and the second terminal group 162, and the data lines 114 of the pixel groups is not limited this example, and the coupling may be made such that a video signal S[J] is supplied from the first driver IC 21 to the data lines 114 of the odd-numbered pixel groups, and the video signal S[J] is supplied from the second driver IC 22 to the data lines 114 of the even-numbered pixel groups.

1-3. Configuration of Terminal Portion

Figure 6:
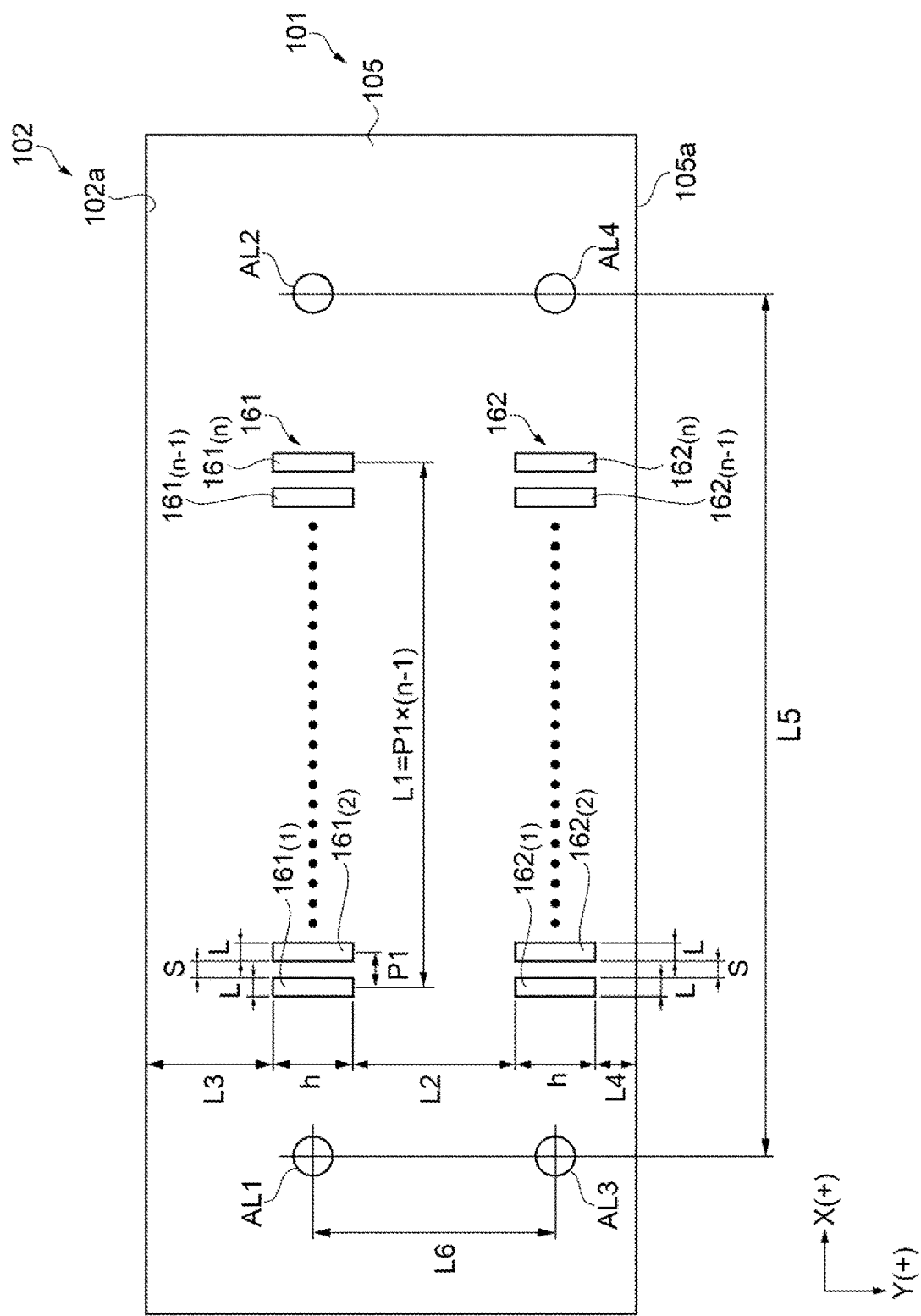
FIG. 6 is a schematic plan view illustrating an arrangement of a group of first terminals and a second terminal group in a terminal portion.

FIG. 6 is a schematic plan view illustrating an arrangement of the first terminal group and the second terminal group in the terminal portion.

As illustrated in FIG. 6, the first terminal group 161, the second terminal group 162, and four alignment marks AL1 to AL4 relating to the mounting of the first flexible wiring substrate 31 and the second flexible wiring substrate 32 described above are arranged on the terminal portion 105 of the element substrate 101. In the Y direction, the first terminal group 161 is provided on the side of one side 102$a$ of the counter substrate 102, in other words, on the display region 110 side, and the second terminal group 162 is provided on the side of the one side 105$a$ of the terminal portion 105. The shape of the alignment marks AL1 to AL4 in this embodiment is circular, but the shape is not limited to this example, and may be a square, a cross, or the like.

The first terminal group 161 is configured to include a terminal $161_{(1)}$, a terminal $161_{(2)}$, to a terminal $161_{(n-1)}$, and a terminal $161_{(n)}$ as n number of first terminals arranged at equal intervals in the positive X direction. Each terminal of the first terminal group 161 has a rectangular shape that is long in the positive Y direction, a width L in the X direction thereof is 40 μm (micrometers), for example, and a length h in the Y direction thereof is 500 μm, for example. The length between the terminals adjacent to each other in the positive X direction, that is, a inter-terminal space S is, for example, 16 μm. In other words, a terminal pitch P1 is 56 μm, for example. When the n number of terminals is 333, for example, a distance L1 from the terminal $161_{(1)}$ to the terminal $161_{(n)}$ arrayed in the positive X direction is P1× (n−1)=56×332=18592 μm.

The second terminal group 162 is configured to include a terminal $162_{(1)}$, a terminal $162_{(2)}$ to a terminal $162_{(n-1)}$, and a terminal $162_{(n)}$ as n number of second terminals arranged at equal intervals in the positive X direction. Each terminal of the second terminal group 162 has a rectangular shape that is long in the positive Y direction, and the width L in the X direction and the length h in the Y direction and the inter-terminal space S thereof are the same as the inter-terminal space S of the first terminal group 161. With respect to the first terminals of the first terminal group 161, the second terminals of the second terminal group 162 are disposed on an opposite side to the one side 102a of the counter substrate 102.

The first terminal group 161 and the second terminal group 162 are disposed side-by-side with a distance L2 therebetween in the positive Y direction. A distance L3 between end portions on the negative Y direction side of the first terminal group 161 and the one side 102a of the counter substrate 102 is 1600 μm, for example. A distance L4 between end portions on the positive Y direction side of the second terminal group 162 and the one side 105a of the terminal portion 105 is 150 μm, for example.

A pair of the alignment marks AL1 and AL2 is provided on either side of the first terminal group 161 in the positive X direction. Similarly, a pair of the alignment marks AL3 and AL4 is provided on either side of the second terminal group 162 in the positive X direction. Both of alignment mark center-to-center distances L5 are 19000 μm, for example. A center-to-center distance L6 between the alignment mark AL1 and the alignment mark AL3 is 2100 μm, for example.

The video signal lines 160 are electrically coupled to each of the plurality of first terminals in the first terminal group 161 and the plurality of second terminals in the second terminal group 162, as illustrated in FIG. 5. In actuality, the first terminal group 161 is arranged closer to the data line selection circuit 150 side, that is, to the display region 110 side, than the second terminal group 162. Accordingly, when the video signal lines 160 are coupled to each of the first terminals of the first terminal group 161 and the second terminals of the second terminal group 162, the length of the video signal lines 160 electrically coupled to the first terminals and the video signal lines 160 electrically coupled to the second terminals differ in length. When the lengths of the video signal lines 160 are different in this way, variations in the electrical characteristics, such as the electrical potential of the video signal transmitted by the video signal line 160, a time of transmission of the video signal to the pixel 111, or in other words, a response time of the video signal, and the like occur, resulting in display unevenness. To improve such display unevenness, the inventors have reviewed the video signal lines 160 electrically coupled to the first terminals of the first terminal group 161 and the second terminals of the second terminal group 162, and have found a new design specification. Hereinafter, a description will be given citing specific examples.

1-4. Example of Video Signal Line

Citing Example 1 to Example 4, the video signal lines 160 electrically coupled to each of the first terminals of the first terminal group 161 and the second terminals of the second terminal group 162 will be described with reference to FIG. 7 to FIG. 10.

Figure 7:
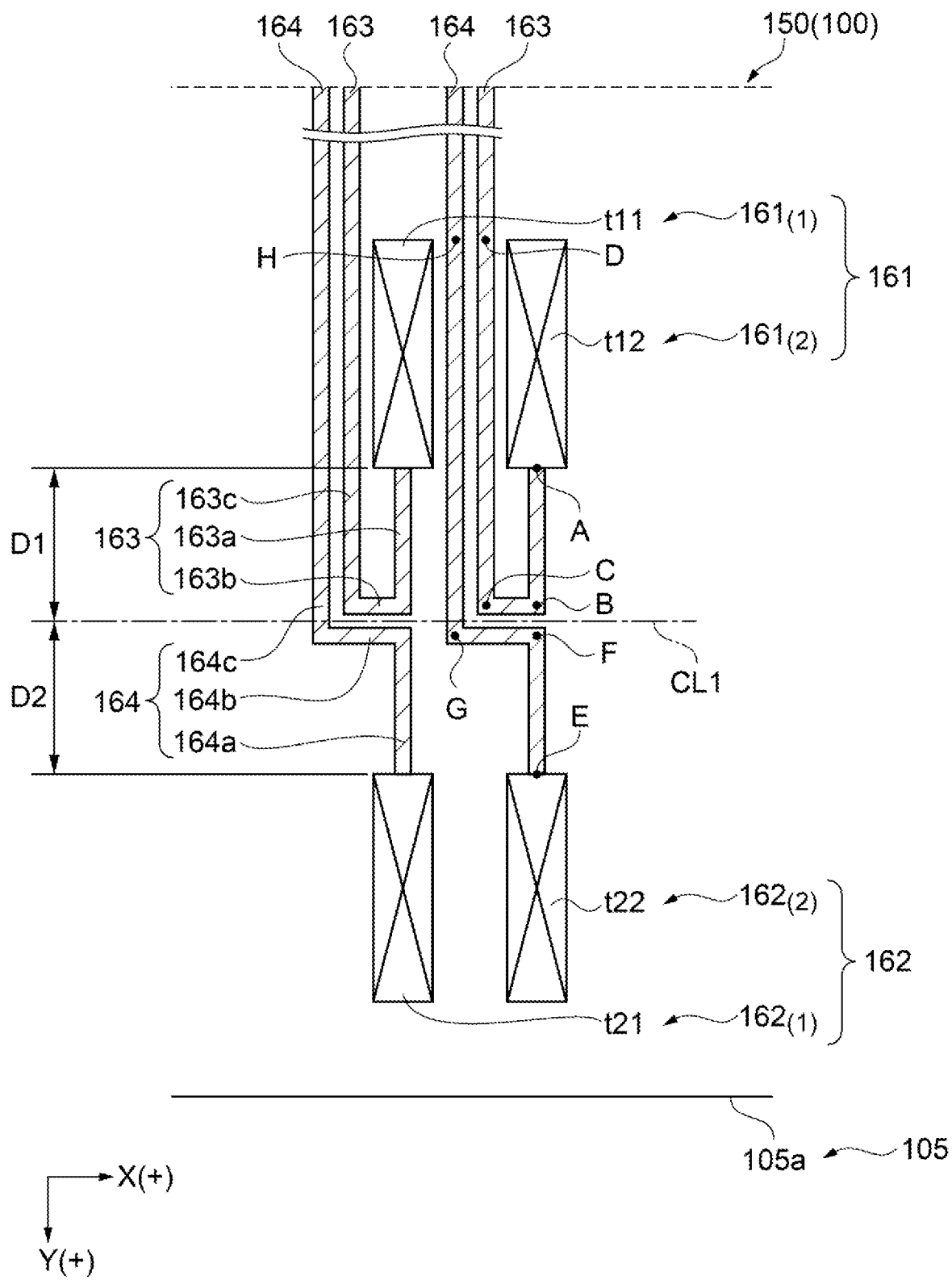
FIG. 7 is a schematic plan view illustrating an arrangement of video signal lines according to Example 1.
Figure 8:
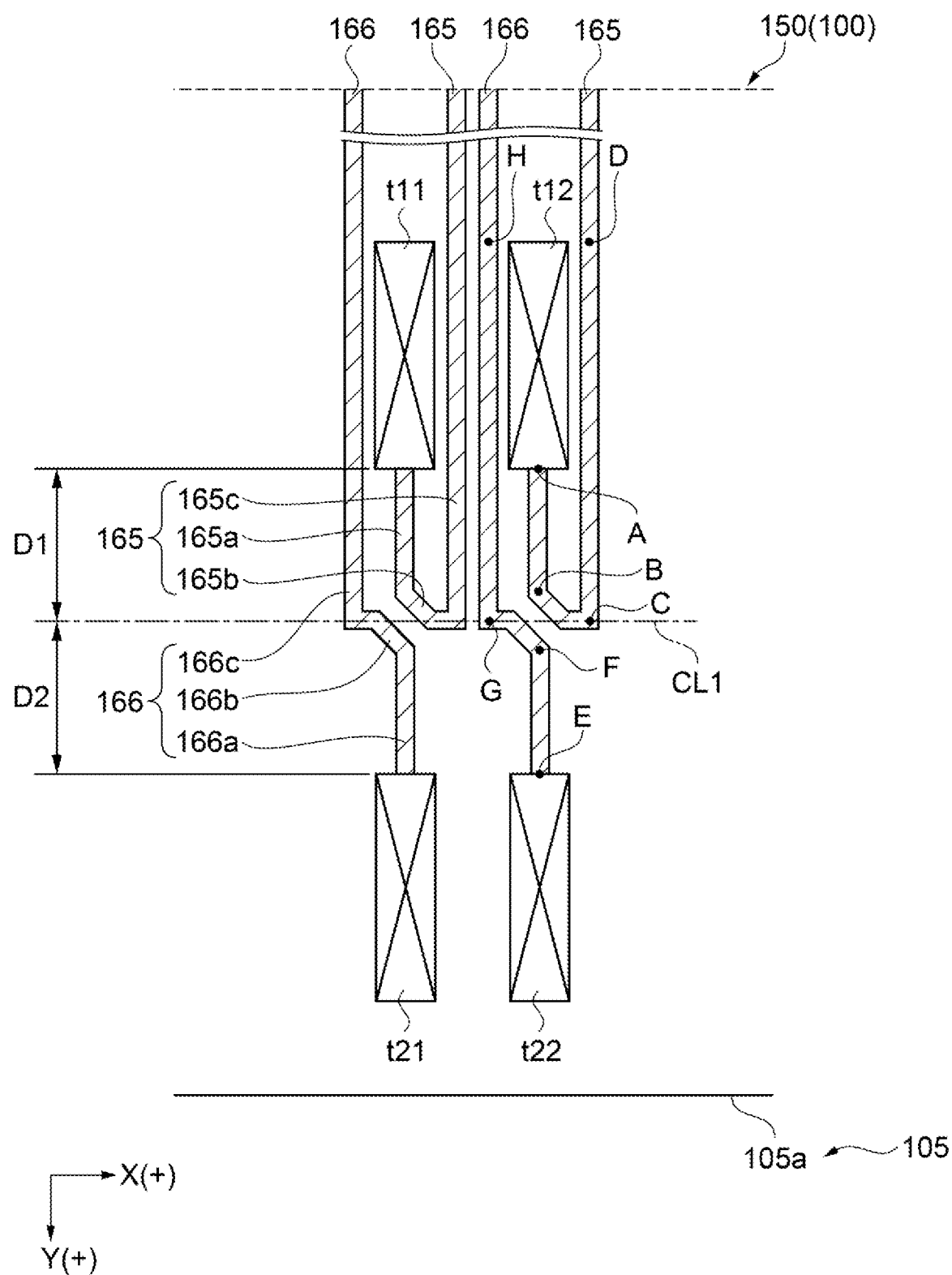
FIG. 8 is a schematic plan view illustrating an arrangement of video signal lines according to Example 2.
Figure 9:
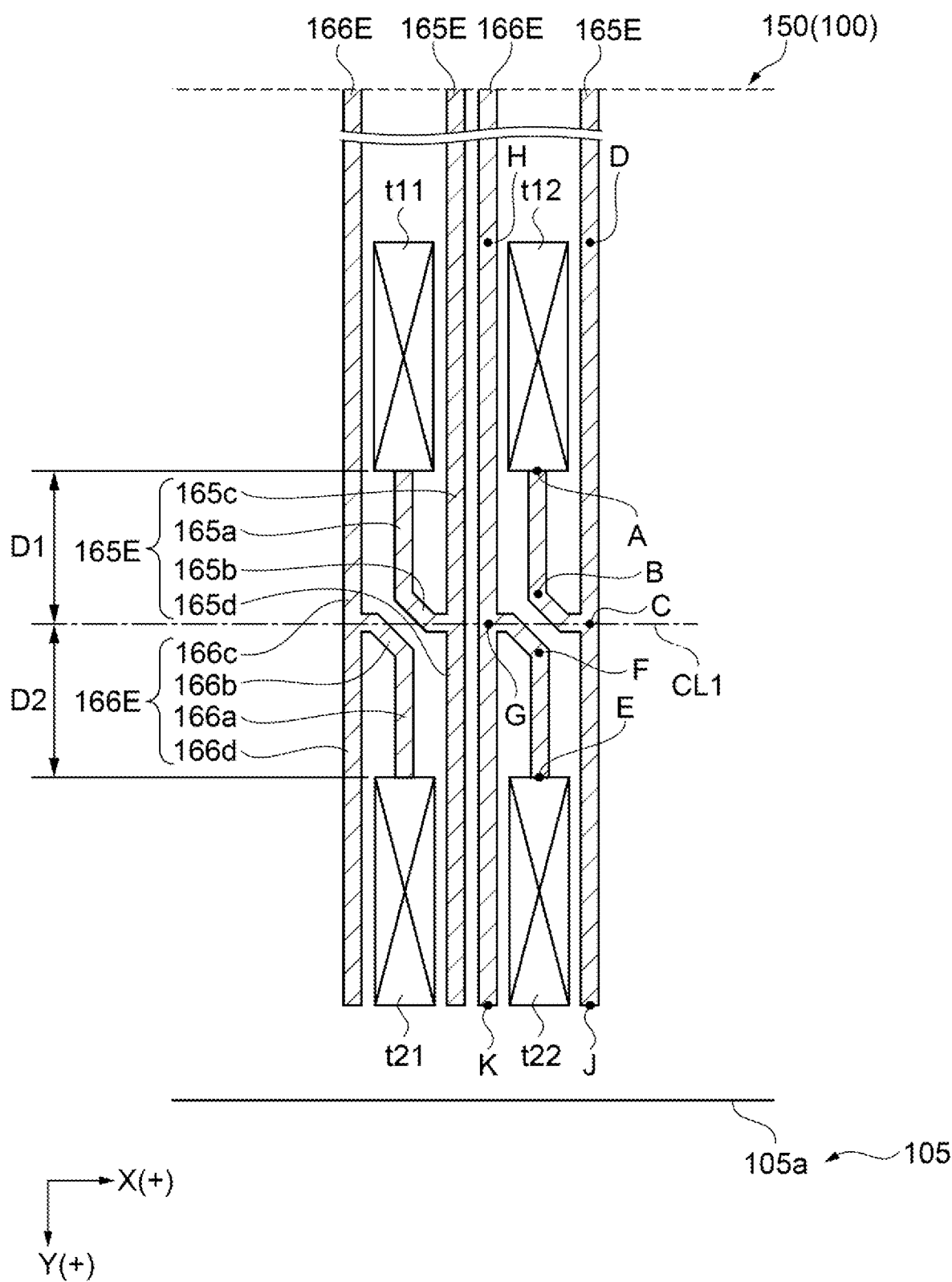
FIG. 9 is a schematic plan view illustrating an arrangement of video signal lines according to Example 3.
Figure 10:
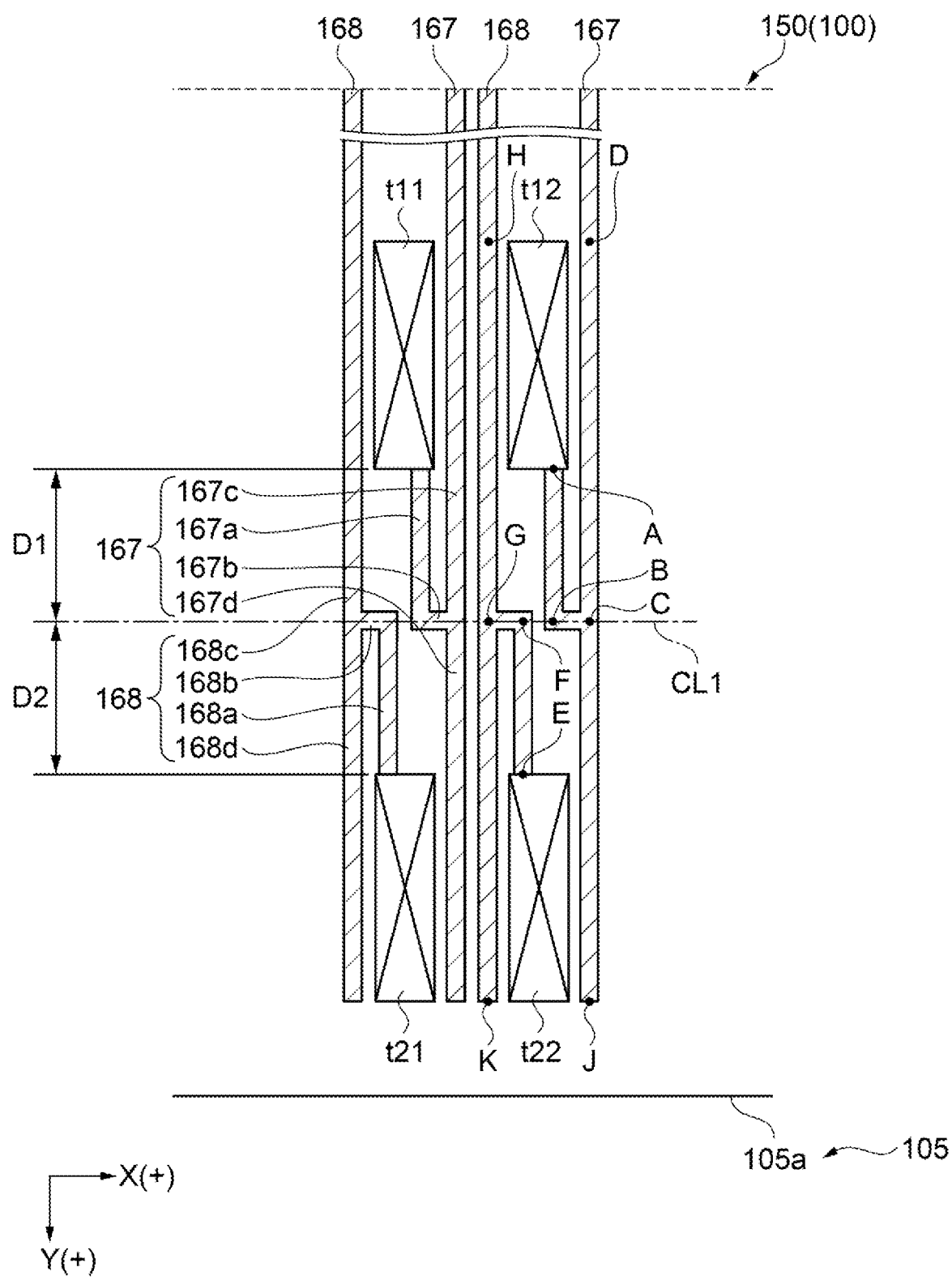
FIG. 10 is a schematic plan view illustrating an arrangement of video signal lines according to Example 4.

FIG. 7 is a schematic plan view illustrating an arrangement of the video signal lines according to Example 1, FIG. 8 is a schematic plan view illustrating an arrangement of the video signal lines according to Example 2, FIG. 9 is a schematic plan view illustrating an arrangement of the video signal lines according to Example 3, and FIG. 10 is a schematic plan view illustrating an arrangement of the video signal lines according to Example 4. Note that each of FIG. 7 to FIG. 10 illustrates the terminal $161_{(1)}$ and the terminal $161_{(2)}$ of the first terminal group 161, the terminal $162_{(1)}$ and the terminal $162_{(2)}$ of the second terminal group 162, and video signal lines electrically coupled to these terminals.

The arrangement of the video signal lines electrically coupled to the other terminals is the same as the arrangement of the video signal lines electrically coupled to these terminals, so an illustration thereof is omitted. Since a format of the video signal lines differs in Example 1 to Example 4, the video signal lines in Example 1 to Example 4 will be described while being assigned respectively different reference signs.

1-4-1. Example 1

As illustrated in FIG. 7, in Example 1, a first video signal line 163 is electrically coupled to the terminal $161_{(1)}$ of the first terminal group 161. Further, a second video signal line 164 is electrically coupled to the terminal $162_{(1)}$ of the second terminal group 162. Similarly, the first video signal line 163 is electrically coupled to the terminal $161_{(2)}$ of the first terminal group 161. Further, the second video signal line 164 is electrically coupled to the terminal $162_{(2)}$ of the second terminal group 162.

The first video signal line 163 includes a first portion 163a that extends from the terminal $161_{(1)}$ toward the second terminal group 162 side, that is, in the positive Y direction, a second portion 163b that extends, from the first portion 163a, in the negative X direction that intersects the first portion 163a, and a third portion 163c that extends, from the second portion 163b, in the negative Y direction toward the data line selection circuit 150 side. As illustrated in FIG. 5, the data line selection circuit 150 is arranged, on the liquid crystal panel 100, between the display region 110 and the first terminal group 161 and the second terminal group 162, and thus, it can be said that the third portion 163c extends toward the display region 110.

The second video signal line 164 includes a fourth portion 164a that extends from the terminal $162_{(1)}$ toward the first terminal group 161 side, that is, in the negative Y direction, a fifth portion 164b that extends, from the fourth portion 164a, in the negative X direction that intersects the fourth portion 164a, and a sixth portion 164c that extends, from the fifth portion 164b, in the negative Y direction toward the data line selection circuit 150 side. Similarly to the third portion 163c, the sixth portion 164c can also be said to extend toward the display region 110.

Hereinafter, for convenience of explanation, the reference sign of the terminal $161_{(1)}$ is denoted as t11, and the reference sign of the other terminal $161_{(2)}$ that is adjacent to the terminal $161_{(1)}$ in the positive X direction is denoted as t12. Similarly, the reference sign of the terminal $162_{(1)}$ is denoted as t21, and the reference sign of the other terminal $162_{(2)}$ that is adjacent to the terminal $162_{(1)}$ in the positive X direction is denoted as t22.

As illustrated in FIG. 7, the length of the first portion 163a of the first video signal line 163 is from a coupling point A with the terminal t12 to a coupling point B with the second portion 163b. The length of the second portion 163b of the first video signal line 163 is from the coupling point B with the first portion 163a to a coupling point C with the third portion 163c. The length of the third portion 163c of the first video signal line 163 is from the coupling point C with the second portion 163b to an intermediate point D. The position of the intermediate point D of the first video signal line 163 in the Y direction is the same as the position of an end portion of the terminal t12 on the negative Y direction side. Such definitions relating to the lengths of the first video signal line 163 are the same with respect to the terminal t11 adjacent to the terminal t12.

As illustrated in FIG. 7, the length of the fourth portion 164a of the second video signal line 164 is from a coupling point E with the terminal t22 to a coupling point F with the fifth portion 164b. The length of the fifth portion 164b of the second video signal line 164 is from the coupling point F with the fourth portion 164a to a coupling point G with the sixth portion 164c. The length of the sixth portion 164c of the second video signal line 164 is from the coupling point G with the fifth portion 164b to an intermediate point H. The position of the intermediate point H of the second video signal line 164 in the Y direction is the same as the position of the intermediate point D of the adjacent first video signal line 163. Such definitions relating to the lengths of the second video signal line 164 are the same with respect to the terminal t21 adjacent to the terminal t22.

When a virtual center line CL1 is provided that divides the distance between the terminal t11 and the terminal t21 in the Y direction into two, a distance D1 between the coupling point A and the center line CL1 is the same as a distance D2 between the coupling point E and the center line CL1. In Example 1, the length of the first portion 163a of the first video signal line 163 and the length of the fourth portion 164a of the second video signal line 164 are the same. The second portion 163b of the first video signal line 163 and the fifth portion 164b of the second video signal line 164 are disposed in parallel on either side of the center line CL1, but the length of the second portion 163b is slightly shorter than the length of the fifth portion 164b. The third portion 163c of the first video signal line 163 and the sixth portion 164c of the second video signal line 164 extend in the Y direction while being adjacent to each other in the X direction, but the length of the third portion 163c is slightly shorter than the length of the sixth portion 164c.

Note that a portion of the first video signal line 163 from the intermediate point D toward the data line selection circuit 150 may be diagonal wiring rather than a simple straight line. It is common for the terminal pitch P1 of the first terminal group 161 to be different from the arrangement pitch of the demultiplexers 151 configuring the data line selection circuit 150, and a bundle of diagonal wiring as described above is used to electrically couple the first terminals of the first terminal group 161 and the demultiplexers 151. Similarly, a bundle of the second video signal lines 164 from the intermediate point H toward the data line selection circuit 150 may be diagonal wiring following the first video signal lines 163, rather than a simple straight line.

In this case, the wiring lengths of the above-described diagonal wiring become different on a left side portion, a center portion, and a right side portion of the data line selection circuit 150 in the X direction. Because the wiring lengths of the above-described diagonal wiring change minutely and smoothly between the adjacent video signal lines, abnormalities in the display are difficult to see. As illustrated in FIG. 6, the present application is designed to solve display abnormalities caused by the occurrence of a difference of as much as 2100 μm in the wiring lengths between the adjacent video signal lines in the terminal portion 105, corresponding to the center-to-center distance L6 between the alignment mark AL1 and the alignment mark AL3.

A line width of the first video signal line 163 and a line width of the second video signal line 164 are the same, and are 5 μm, for example. When considering, in conjunction with an example in which the inter-terminal space S is 16 μm in FIG. 6, a gap between the terminal t12 and the third portion 163c of the first video signal line 163, the gap between the third portion 163c of the first video signal line 163 and the sixth portion 164c of the second video signal line 164, and the gap between the sixth portion 164c of the second video signal line 164 and the terminal t11 can each be 2 μm. In the element substrate 101, the first video signal lines 163 and the second video signal lines 164 are formed in the same wiring layer using the same wiring material. Accordingly, compared to a case in which the video signal lines are arranged so as to form the respective couplings from the demultiplexer 151 of the data line selection circuit 150 to the terminal t11 and the terminal t21 in a shortest distance, the first video signal line 163 and the second video signal line 164 in Example 1 have substantially the same electrical resistance. Further, the second portion 163b and the fifth portion 164b are parallel with each other along the X direction, and the third portion 163c and the sixth portion 164c extending toward the data line selection circuit 150 side are parallel with each other along a long side of the terminal t11 on the negative X direction side. Thus, the wiring capacity of the first video signal line 163 including the parasitic capacitance generated between the second portion 163b and the fifth portion 164b and between the third portion 163c and the sixth portion 164c is substantially the same as the wiring capacity of the second video signal line 164 including the parasitic capacitance described above. In other words, the first video signal line 163 and the second video signal line 164 have substantially the same electrical properties. Note that in Example 1, the second portion 163b is arranged so as to extend in the negative X direction with respect to the first portion 163a of the first video signal line 163, and, in the same way, the fifth portion 164b is arranged so as to extend in the negative X direction with respect to the fourth portion 164a of the second video signal line 164, but the configuration is not limited to this example. The second portion 163b may be arranged to extend in the positive X direction with respect to the first portion 163a, and the fifth portion 164b may also be arranged to extend in the positive X direction with respect to the fourth portion 164a.

Also, in order to correct differences in resistance values due to differences between the length of the second portion 163b of the first video signal line 163 and the length of the fifth portion 164b of the second video signal line 164 and between the length of the third portion 163c of the first video signal line 163 and the length of the sixth portion 164c of the second video signal line 164, the coupling points B, C, F, and G may be arranged closer to the terminal t22 side than to the virtual center line CL1. For example, when the coupling points B, C, F, and G are offset by 5 μm from the virtual center line CL1 to the terminal t22 side, for the first video signal line 163, the path length from the coupling point A to the intermediate point D is extended by 10 μm. On the other hand, for the second video signal line 164, the path length from the coupling point E to the intermediate point H does not change. This is one effect of the configuration in which the first portion 163a is provided in the first video signal line 163. In this way, the first video signal line 163 and the second video signal line 164 have an even more preferable form because similarities in the resistance value are increased.

1-4-2. Example 2

As illustrated in FIG. 8, in Example 2, a first video signal line 165 is electrically coupled to the terminal t11 of the first terminal group 161. Further, a second video signal line 166 is electrically coupled to the terminal t21 of the second terminal group 162. Similarly, the first video signal line 165 is electrically coupled to the terminal t12 of the first terminal group 161. Further, the second video signal line 166 is electrically coupled to the terminal t22 of the second terminal group 162.

The first video signal line 165 includes a first portion 165a that extends from the terminal t11 toward the second terminal group 162 side, that is, in the positive Y direction, a second portion 165b that extends from the first portion 165a in a direction diagonally intersecting the first portion 165a at 45 degrees, and a third portion 165c that extends from the second portion 165b in the negative Y direction to the data line selection circuit 150 side. The third portion 165c extends in the negative Y direction along the long side of the terminal t11, on the positive X direction side.

The second video signal line 166 includes a fourth portion 166a that extends from the terminal t21 toward the first terminal group 161 side, that is, in the negative Y direction, a fifth portion 166b that extends from the first portion 166a in a direction diagonally intersecting the first portion 165a at 45 degrees and extends in parallel with the second portion 165b of the first video signal line 165, and the sixth portion 166c that extends from the fifth portion 166b in the negative Y direction to the data line selection circuit 150 side. The sixth portion 166c extends in the negative Y direction along the long side of the terminal t11, on the negative X direction side. In Example 2, the third portion 165c of the first video signal line 165 and the sixth portion 166c of the second video signal line 166 extend in parallel in the negative Y direction between the terminal t11 and the terminal t12 adjacent to each other in the X direction.

As illustrated in FIG. 8, the length of the first portion 165a of the first video signal line 165 is from the coupling point A with the terminal t12 to the coupling point B with the second portion 165b. The length of the second portion 165b of the first video signal line 165 is from the coupling point B with the first portion 165a to the coupling point C with the third portion 165c. The coupling point C in Example 2 is positioned on the virtual center line CL1. The length of the third portion 165c of the first video signal line 165 is from the coupling point C with the second portion 165b to the intermediate point D. In this case, the position of the intermediate point D of the first video signal line 165 in the Y direction is the same as the position of the end portion of the terminal t12 on the negative Y direction side. Such definitions of the lengths of the first video signal line 165 according to Example 2 are the same with respect to the terminal t11 adjacent to the terminal t12.

As illustrated in FIG. 8, when the virtual center line CL1 is provided that divides the distance between the terminal t11 and the terminal t21 in the Y direction into two, the distance D1 between the coupling point A and the center line CL1 is the same as the distance D2 between the coupling point E and the center line CL1. The length of the fourth portion 166a of the second video signal line 166 is from the coupling point E with the terminal t22 to the coupling point F with the fifth portion 166b. The length of the fifth portion 166b of the second video signal line 166 is from the coupling point F with the fourth portion 166a to the coupling point G with the sixth portion 166c. The coupling point G in Example 2 is positioned on the virtual center line CL1. The length of the sixth portion 166c of the second video signal line 166 is from the coupling point G with the fifth portion 166b to the intermediate point H In this case, the position of the intermediate point H of the second video signal line 166 in the Y direction is the same as the position of the end portion of the adjacent terminal t12 on the negative Y direction side. Such definitions of the lengths of the second video signal line 166 according to Example 2 are the same with respect to the terminal t21 adjacent to the terminal t22.

In Example 2, the length of the first portion 165a of the first video signal line 165 and the length of the fourth portion 166a of the second video signal line 166 are the same. Further, the length of the second portion 165b of the first video signal line 165 and the length of the fifth portion 166b of the second video signal line 166 are the same. Furthermore, the length of the third portion 165c of the first video signal line 165 and the length of the sixth portion 166c of the second video signal line 166 are the same. In other words, the length of the first video signal line 165 and the length of the second video signal line 166 are the same.

Note that a bundle of the first video signal lines 165 from the intermediate point D toward the data line selection circuit 150 may be diagonal wiring rather than a simple straight line. Similarly, a bundle of the second video signal lines 166 from the intermediate point H toward the data line selection circuit 150 may be diagonal wiring following the first video signal lines 165, rather than a simple straight line.

A line width of the first video signal line 165 and a line width of the second video signal line 166 are the same, and are 5 μm, for example. In the element substrate 101, the first video signal lines 165 and the second video signal lines 166 are formed in the same wiring layer using the same wiring material. Accordingly, the first video signal line 165 and the second video signal line 166 in Example 2 have the same electrical resistance. Further, the second portion 165b and the fifth portion 166b are inclined at an angle of 45 degrees with respect to the X direction and are parallel with each other, and the third portion 165c and the sixth portion 166c extending toward the data line selection circuit 150 are parallel with each other along the long side of the terminal t11. Thus, the wiring capacity of the first video signal line 165 including the parasitic capacitance generated between the second portion 165b and the fifth portion 166b and between the third portion 165c and the sixth portion 166c is substantially the same as the wiring capacity of the second video signal line 166 including the parasitic capacitance described above. In other words, the first video signal line 165 and the second video signal line 166 have substantially the same electrical properties. Note that the inclination angle of the second portion 165b and the fifth portion 166b is not limited to 45 degrees.

1-4-3. Example 3

As illustrated in FIG. 9, in Example 3, a first video signal line 165E is electrically coupled to the terminal t11 of the first terminal group 161. Further, a second video signal line 166E is electrically coupled to the terminal t21 of the second terminal group 162. Similarly, the first video signal line 165E is electrically coupled to the terminal t12 of the first terminal group 161. Further, the second video signal line 166E is electrically coupled to the terminal t22 of the second terminal group 162. Example 3 is a modified example of Example 2, and the same reference signs are assigned to the same configuration as that of Example 2.

The first video signal line 165E includes the first portion 165a extending from the terminal t11 toward the second terminal group 162 side, that is, in the positive Y direction, and the second portion 165b that extends from the first portion 165a in a direction diagonally intersecting the first portion 165a at 45 degrees, the third portion 165c that extends from the second portion 165b in the negative Y direction to the data line selection circuit 150 side, and a first extending portion 165d that extends from the third portion 165c in the positive Y direction that is on the opposite side from the data line selection circuit 150. The third portion 165c extends in the negative Y direction along the long side of the terminal t11, on the positive X direction side, and the first extending portion 165d extends in the positive Y direction along the long side of the terminal t21, on the positive X direction side.

The second video signal line 166E includes the fourth portion 166a that extends from the terminal t21 toward the first terminal group 161 side, that is, in the negative Y direction, the fifth portion 166b that extends from the fourth portion 166a in a direction diagonally intersecting the fourth portion 166a at 45 degrees and extends in parallel with the second portion 165b of the first video signal line 165E, the sixth portion 166c that extends from the fifth portion 166b in the negative Y direction to the data line selection circuit 150 side, and a second extended portion 166d that extends from the sixth portion 166c in the positive Y direction that is on the opposite side from the data line selection circuit 150. The sixth portion 166c extends in the negative Y direction along the long side of the terminal t11, on the negative X direction side, and the second extending portion 166d extends in the positive Y direction along the long side of the terminal t21, on the negative X direction side. In Example 3, the third portion 165c of the first video signal line 165E and the sixth portion 166c of the second video signal line 166E extend in parallel to each other between the terminal t11 and the terminal t12 adjacent to each other in the X direction. Further, the first extending portion 165d of the first video signal line 165E and the second extending portion 166d of the second video signal line 166E extend in parallel to each other between the terminal t21 and the terminal t22 adjacent to each other in the X direction.

As illustrated in FIG. 9, the length of the first portion 165a of the first video signal line 165E is from the coupling point A with the terminal t12 to the coupling point B with the second portion 165b. The length of the second portion 165b of the first video signal line 165E is from the coupling point B with the first portion 165a to the coupling point C with the third portion 165c. The coupling point C in Example 3 is positioned on the virtual center line CL1. The length of the third portion 165c of the first video signal line 165E is from the coupling point C with the second portion 165b to the intermediate point D. In this case, the position of the intermediate point D of the first video signal line 165 in the Y direction is the same as the position of the end portion of the terminal t12 on the negative Y direction side. The length of the first extending portion 165d of the first video signal line 165E is from the coupling point C with the third portion 165c to an end portion J on the side opposite from the data line selection circuit 150. The position of the end portion J in the positive Y direction is the same as the position of the end portion of the terminal t22 in the positive Y direction. In other words, a distance between the end portion J and the one side 105a of the terminal portion 105 is a distance L4, as illustrated in FIG. 6, and is 150 μm, for example. Such definitions of the lengths of the first video signal line 165E according to Example 3 are the same with respect to the terminal t11 adjacent to the terminal t12.

As illustrated in FIG. 9, the length of the fourth portion 166a of the second video signal line 166E is from the coupling point E with the terminal t22 to the coupling point F with the fifth portion 166b. The length of the fifth portion 166b of the second video signal line 166E is from the coupling point F with the fourth portion 166a to the coupling point G with the sixth portion 166c. The coupling point G in Example 3 is positioned on the virtual center line CL1. The length of the sixth portion 166c of the second video signal line 166E is from the coupling point G with the fifth portion 166b to the intermediate point H. In this case, the position of the intermediate point H of the second video signal line 166E in the Y direction is the same as the position of the end portion of the adjacent terminal t12 on the negative Y direction side. The length of the second extending portion 166d of the second video signal line 166E is from the coupling point G with the sixth portion 166c to an end portion K on the side opposite from the data line selection circuit 150. The position of the end portion K in the positive Y direction is the same as the position of the end portion of the terminal t22 in the positive Y direction. In other words, a distance between the end portion K and the one side 105a of the terminal portion 105 is the distance L4, as illustrated in FIG. 6, and is 150 μm, for example. Such definitions of the lengths of the second video signal line 166E according to Example 3 are the same with respect to the terminal t21 adjacent to the terminal t22.

Note that the end portion J of the first extending portion 165d and the end portion K of the second extending portion 166d may reach the one side 105a of the terminal portion 105, or may be configured to be coupled to a test signal line, or a guard ring for suppressing electrostatic breakdown (both not illustrated).

In Example 3, the length of the first portion 165a of the first video signal line 165E and the length of the fourth portion 166a of the second video signal line 166E are the same. Further, the length of the second portion 165b of the first video signal line 165E and the length of the fifth portion 166b of the second video signal line 166E are the same. Furthermore, the lengths of the third portion 165c and the first extending portion 165d of the first video signal line 165E and the lengths of the sixth portion 166c and the second extending portion 166d of the second video signal line 166E are the same.

A line width of the first video signal line 165E and a line width of the second video signal line 166E are the same, and are 5 μm, for example. In the element substrate 101, the first video signal lines 165E and the second video signal lines 166E are formed in the same wiring layer using the same wiring material. Accordingly, the first video signal line 165E and the second video signal line 166E in Example 3 have the same electrical resistance. In addition, Example 3 has a configuration in which the first extending portion 165d and the second extending portion 166d are added to the configuration of Example 2. Therefore, where, in Example 2, there is no wiring adjacent in the X direction with respect to the fourth portion 166a of the second video signal line 166, in Example 3, the first extending portion 165d is arranged adjacent to the fourth portion 166a on the positive X direction side, and the second extending portion 166d is arranged adjacent to the fourth portion 166a on the negative X direction side. Thus, with respect to the first video signal line 165 and the second video signal line 166 in Example 2, the first video signal line 165E and the second video signal line 166E of Example 3 are superior in terms of making the wiring capacity the same. In other words, in comparison to Example 2, in Example 3, the electrical properties of the first video signal line 165E and the second video signal line 166E can be made the same in a region from the end portion on the data line selection circuit 150 side of the first terminal group 161 to the end portion on the one side 105a side of the terminal portion 105 of the second terminal group 162. Specifically, even with the configuration in which the first terminal group 161 and the second terminal group 162 are arranged in the terminal portion 105 so as to be separated from each other in the Y direction, wiring of the video signal lines having the same electrical properties can be realized.

1-4-4. Example 4

As illustrated in FIG. 10, in Example 4, a first video signal line 167 is electrically coupled to the terminal t11 of the first terminal group 161. Further, a second video signal line 168 is electrically coupled to the terminal t21 of the second terminal group 162. Similarly, the first video signal line 167 is electrically coupled to the terminal t12 of the first terminal group 161. Further, the second video signal line 168 is electrically coupled to the terminal t22 of the second terminal group 162. Example 4 is a modified example of Example 3.

The first video signal line 167 includes a first portion 167a that extends from the terminal t11 toward the second terminal group 162 side, that is, in the positive Y direction, a second portion 167b that extends, from the first portion 167a, in the negative X direction that intersects the first portion 167a, a third portion 167c that extends from the second portion 167b in the negative Y direction toward the data line selection circuit 150 side, and a first extending portion 167d that extends from the third portion 167c in the positive Y direction, on the side opposite to the data line selection circuit 150. The third portion 167c extends in the negative Y direction along the long side of the terminal t11, on the positive X direction side, and the first extending portion 167d extends in the positive Y direction along the long side of the terminal t21, on the positive X direction side.

The second video signal line 168 includes a fourth portion 168a that extends from the terminal t21 toward the first terminal group 161 side, that is, in the negative Y direction, a fifth portion 168b that extends from the fourth portion 168a so as to intersect the fourth portion 168b, and extends in the negative X direction that is the direction opposite to the second portion 167b of the first video signal line 167, a sixth portion 168c that extends from the fifth portion 168b in the negative Y direction toward the data line selection circuit 150 side, and a second extending portion 168d that extends from the sixth portion 168c in the positive Y direction on the side opposite to the data line selection circuit 150. The sixth portion 168c extends in the negative Y direction along the long side of the terminal t11, on the negative X direction side, and the second extending portion 168d extends in the positive Y direction along the long side of the terminal t21, on the negative X direction side. The third portion 167c of the first video signal line 167 and the sixth portion 168c of the second video signal line 168 extend in parallel to each other between the terminal t11 and the terminal t12 adjacent to each other in the X direction. Further, the first extending portion 167d of the first video signal line 167 and the second extending portion 168d of the second video signal line 168 extend in parallel to each other between the terminal t21 and the terminal t22 adjacent to each other in the X direction.

As illustrated in FIG. 10, when the virtual center line CL1 is provided that divides the distance between the terminal t11 and the terminal t21 in the Y direction into two, the distance D1 between the coupling point A and the center line CL1 is the same as the distance D2 between the coupling point E and the center line CL1. The length of the first portion 167a of the first video signal line 167 is from the coupling point A with the terminal t12 to the coupling point B with the second portion 167b. The length of the second portion 167b of the first video signal line 167 is from the coupling point B with the first portion 167a to the coupling point C with the third portion 167c. The coupling point B and the coupling point C in Example 4 are positioned on the virtual center line CL1. The length of the third portion 167c of the first video signal line 167 is from the coupling point C with the second portion 167b to the intermediate point D. In this case, the position of the intermediate point D of the first video signal line 167 in the Y direction is the same as the position of the end portion of the terminal t12 on the negative Y direction side. The length of the first extending portion 167d of the first video signal line 167 is from the coupling point C with the third portion 167c to the end portion J on the side opposite to the display region 110. The position of the end portion J in the positive Y direction is the same as the position of the end portion of the terminal t22 in the positive Y direction. Such definitions of the lengths of the first video signal line 167 according to Example 4 are the same with respect to the terminal t11.

As illustrated in FIG. 10, the length of the fourth portion 168a of the second video signal line 168 is from the coupling point E with the terminal t22 to the coupling point F with the fifth portion 168b. The length of the fifth portion 168b of the second video signal line 168 is from the coupling point F with the fourth portion 168a to the coupling point G with the sixth portion 168c. The coupling point F and the coupling point G in Example 4 are positioned on the virtual center line CL1. The length of the sixth portion 168c of the second video signal line 168 is from the coupling point G with the fifth portion 168b to the intermediate point H. The length of the second extending portion 168d of the second video signal line 168 is from the coupling point G with the sixth portion 168c to the end portion K on the side opposite to the data line selection circuit 150. The position of the end portion K in the positive Y direction is the same as the position of the end portion of the terminal t22 in the positive Y direction. Such definitions of the lengths of the second video signal line 168 according to Example 4 are the same with respect to the terminal t21.

As illustrated in FIG. 10, in Example 4, the length of the first portion 167a of the first video signal line 167 is the distance D1, and the length of the fourth portion 168a of the second video signal line 168 is the distance D2. Since D1 is equal to D2, both lengths are the same. Further, the length of the second portion 167b of the first video signal line 167 and the length of the fifth portion 168b of the second video signal line 168 are the same. Furthermore, the lengths of the third portion 167c and the first extending portion 167d of the first video signal line 167 and the lengths of the sixth portion 168c and the second extending portion 168d of the second video signal line 168 are the same. In other words, the length of the first video signal line 167 and the length of the second video signal line 168 are the same.

Note that a bundle of the first video signal lines 167 from the intermediate point D toward the data line selection circuit 150 may be diagonal wiring rather than a simple straight line. Similarly, a bundle of the second video signal lines 168 from the intermediate point H toward the data line selection circuit 150 may be diagonal wiring line following the first video signal lines 167, rather than a simple straight line.

Also, the end portion J of the first extending portion 167d and the end portion K of the second extending portion 168d may reach the one side 105a of the terminal portion 105, or may be configured to be coupled to a test signal line, or a guard ring for suppressing electrostatic breakdown (both not illustrated).

A line width of the first video signal line 167 and a line width of the second video signal line 168 are the same, and are 5 μm, for example. In the element substrate 101, the first video signal lines 167 and the second video signal lines 168 are formed in the same wiring layer using the same wiring material. Accordingly, the first video signal line 167 and the second video signal line 168 according to Example 4 have the same electrical resistance. Further, since the first extending portion 167d and the second extending portion 168d are provided in Example 4 in the same manner as in Example 3, the wiring capacity of the first video signal line 167 and the wiring capacity of the second video signal line 168 can be made the same. In addition, in Example 4, the second portion 167b of the first video signal line 167 and the fifth portion 168b of the second video signal line 168 are arranged in a straight line on the virtual center line CL1. Thus, in comparison to Example 3, since the parasitic capacitance between the second portion 167b and the fifth portion 168b becomes smaller, the wiring capacity of the first video signal line 167 and the second video signal line 168 can be reduced. Further, in comparison to Example 3, since an interval between the first portion 167a of the first video signal line 167 and the sixth portion 168c of the second video signal line 168 increases, the parasitic capacitance of this region also becomes smaller. On the other hand, an interval between the first portion 167a and the third portion 167c of the first video signal line 167 is narrowed, but the parasitic capacitance does not become a problem due to being the same node (the first video signal line 167).

Of the above-described Example 1 to Example 4, in Example 2 to Example 4, there is no adjacent video signal line in the third portion of the first video signal line that is electrically coupled to the terminal $161_{(n)}$ positioned at the end of the first terminal group 161 on the positive X direction side. Further, there is no adjacent video signal line in the sixth portion of the second video signal line that is electrically coupled to the terminal $162_{(1)}$ positioned at the end of the second terminal group 162 on the negative X direction side. As a result, the wiring capacity of the video signal lines positioned on both of the ends on either side of the first terminal group 161 and the second terminal group 162 in the X direction becomes different from the wiring capacity of the other video signal lines. In such a case, if the pixels coupled to the video signal lines positioned on both of these ends are caused to be dummy pixels that do not contribute to the display, it is possible to cause display unevenness caused by differences in the wiring capacity of the video signal lines to be not visually recognized.

According to the liquid crystal device 1 of the above-described Embodiment 1, the following effects can be obtained.

(1) In the terminal portion 105 of the element substrate 101, the first video signal line that is electrically coupled to the first terminal of the first terminal group 161 arranged on the data line selection circuit 150 side is configured to include the first portion that extends to the side of the second terminal group 162 disposed in a position further away from the data line selection circuit 150 than the first terminal group 161. Further, the second video signal line that is electrically coupled to the second terminal of the second terminal group 162 is configured to include the fourth portion that extends toward the side of the first terminal group 161. The first portion and the fourth portion are disposed in parallel with each other between the first terminal group 161 and the second terminal group 162, and the line widths and the lengths thereof are the same. Thus, in comparison to a case in which the first video signal line is coupled to the short side, which is oriented toward the data line selection circuit 150 side, of the first terminal of the first terminal group 161, and the second video signal line is disposed on the short side, which is oriented toward the data line selection circuit 150 side, of the second terminal of the second terminal group 162, the electrical properties of the first video signal line and the second video signal line can be made substantially the same. As a result, the liquid crystal device 1 can be provided as the electro-optical device in which display unevenness caused by the electrical properties of the first video signal line and the second video signal line being different is improved. Further, since the first video signal lines and the second video signal lines are formed in the same wiring layer with the same line width, a design burden can be reduced.

(2) The second portion of the first video signal line intersecting the first portion, and the fifth portion of the second video signal line intersecting the fourth portion are preferably arranged so as to be inclined with respect to the X direction and to face each other, as in Example 2 and Example 3, or are preferably disposed in a straight line on the virtual center line CL1 that extends in the X direction, as in Example 4. In this way, the length of the second portion and the length of the fifth portion can be made the same, and the length of the third portion and the length of the sixth portion can be made the same. As a result, because the electrical resistance of the first video signal line and the electrical resistance of the second video signal line become the same, display unevenness caused by differences in the electrical resistance between the first video signal line and the second video signal line can be further improved.

(3) Between the first terminal of the first terminal group 161 and the other terminal adjacent to the first terminal, the third portion of the first video signal line extending toward the data line selection circuit 150 side, and the sixth portion of the second video signal line similarly extending toward the data line selection circuit 150 side are arranged in parallel with each other along the long side of the first terminal. Accordingly, the wiring capacity of the first video signal line and that of the second video signal line, including the parasitic capacitance generated in the adjacent wiring portions, can be made substantially the same. In this way, display unevenness caused by differences in the wiring capacity (the wiring time constant) between the first video signal line and the second video signal line can be improved.

(4) By providing, on the third portion of the first video signal line, the first extending portion that extends to the side opposite to the data line selection circuit 150, and similarly providing, on the sixth portion of the second video signal line, the second extending portion that extends to the side opposite to the data line selection circuit 150, the wiring capacity of the first video signal line and that of the second video signal line, including the parasitic capacitance generated in the adjacent wiring portions, can be made the same. As a result, display unevenness caused by differences in the wiring capacity (the wiring time constant) between the first video signal line and the second video signal line can be further improved.

2. Embodiment 2

2-1. Electro-Optical Device

Next, the electro-optical device of Embodiment 2 is described using the liquid crystal device as an example, as in Embodiment 1. The liquid crystal device serving as the electro-optical device of Embodiment 2 is provided with an electrostatic protection circuit on the video signal lines, in the element substrate 101 of the liquid crystal device 1 according to Embodiment 1 described above. Thus, the same reference signs are assigned to the same configuration as that of the liquid crystal device 1 of Embodiment 1 described above, and a detailed description thereof is omitted. Further, a configuration including video signal lines and an electrostatic protection circuit is described using specific examples, namely, Example 5 and Example 6, and with reference to FIG. 11 to FIG. 17.

2-1-5. Example 5

Figure 11:
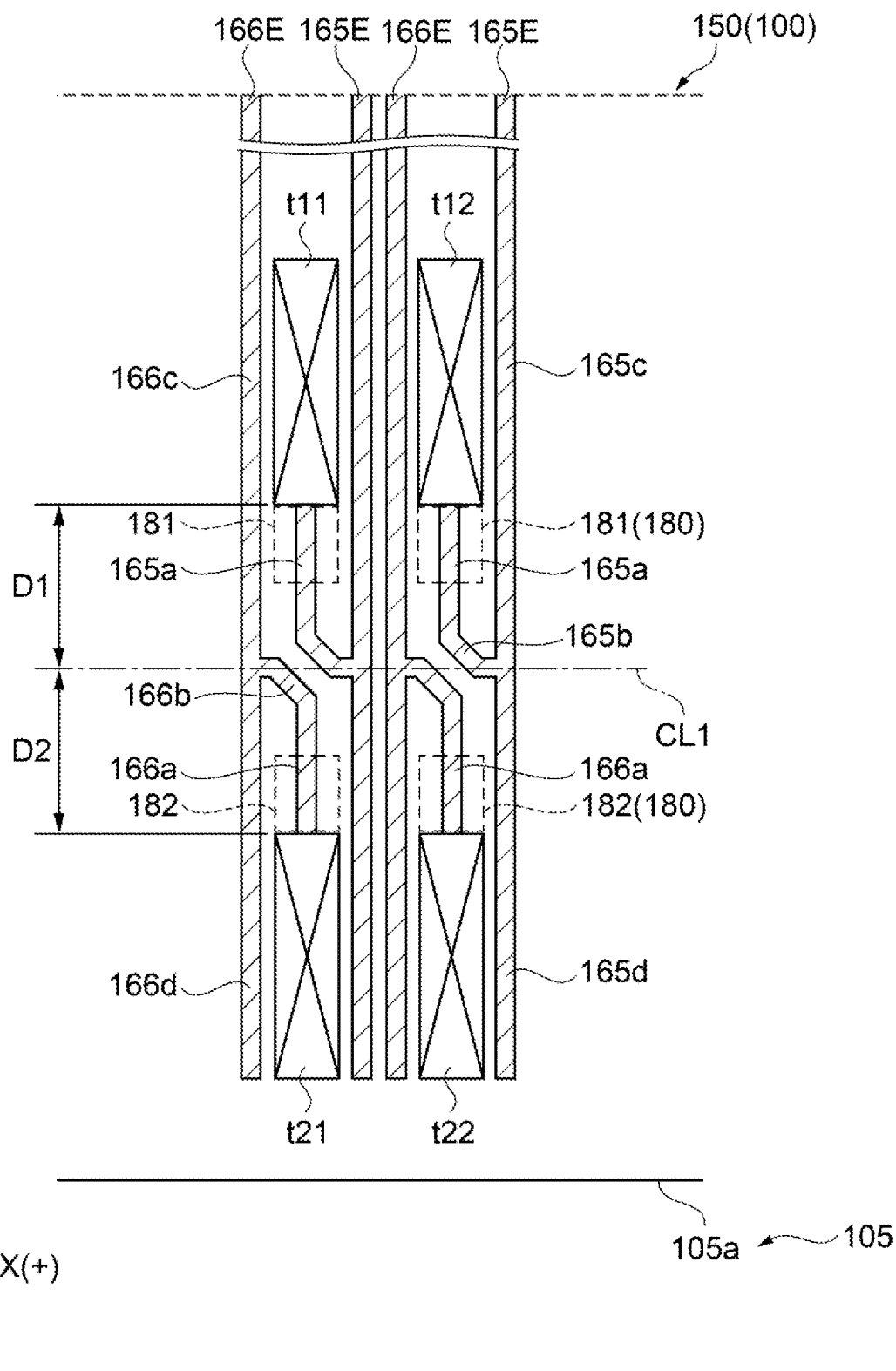
FIG. 11 is a schematic plan view illustrating an arrangement of the video signal lines and electrostatic protection circuits according to Example 5 of Embodiment 2.
Figure 12:
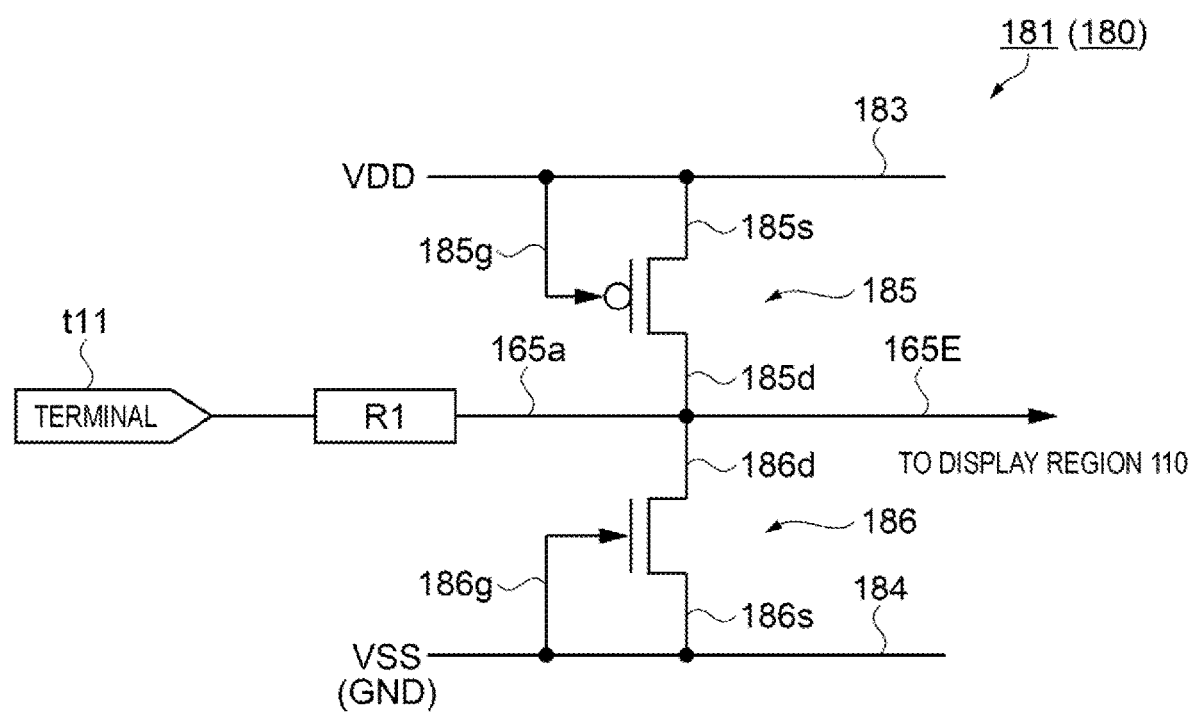
FIG. 12 is a circuit diagram illustrating an example of an electrical configuration of the electrostatic protection circuit.
Figure 13:
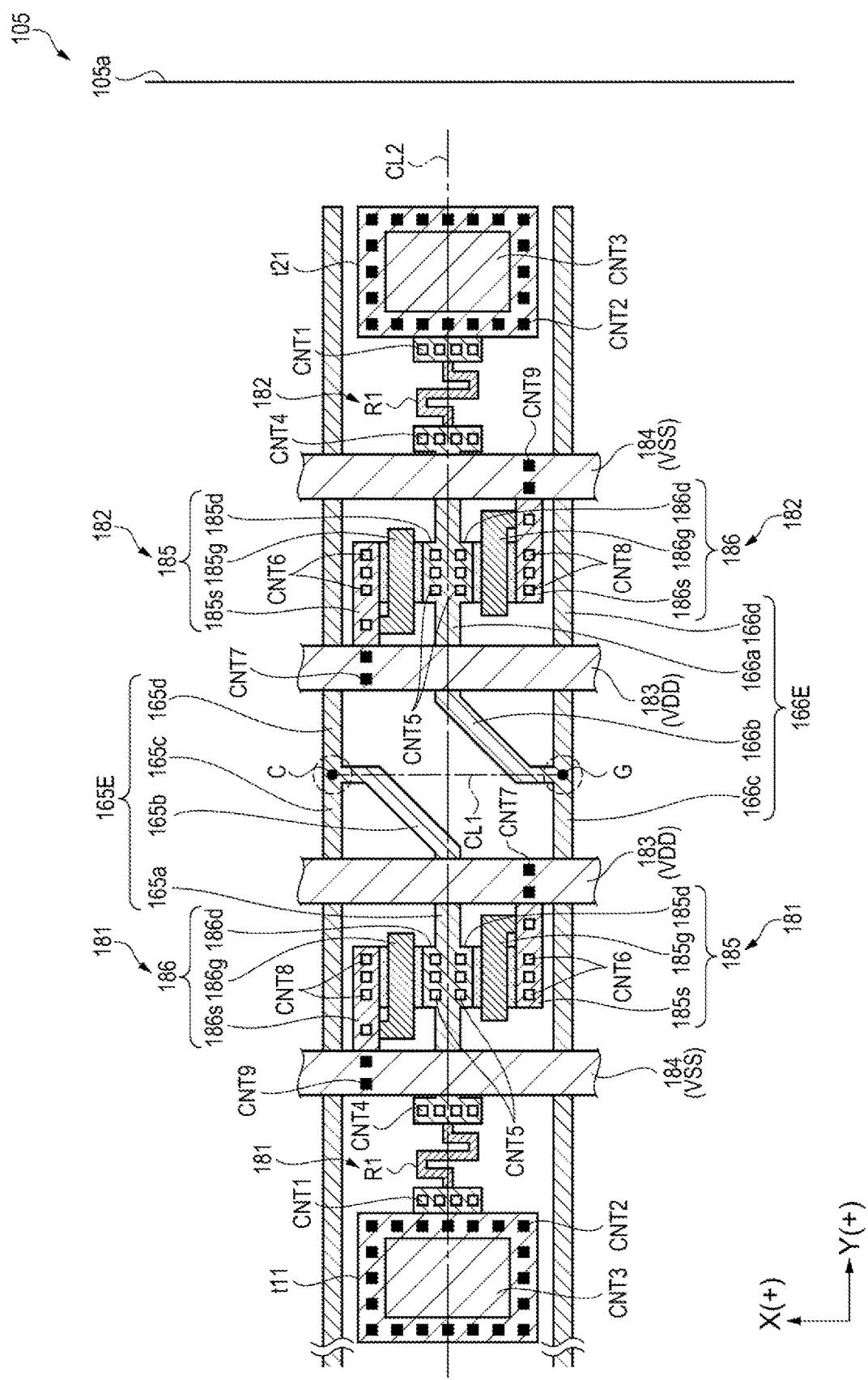
FIG. 13 is a schematic plan view illustrating an arrangement of transistors of the electrostatic protection circuit according to Example 5.
Figure 14:
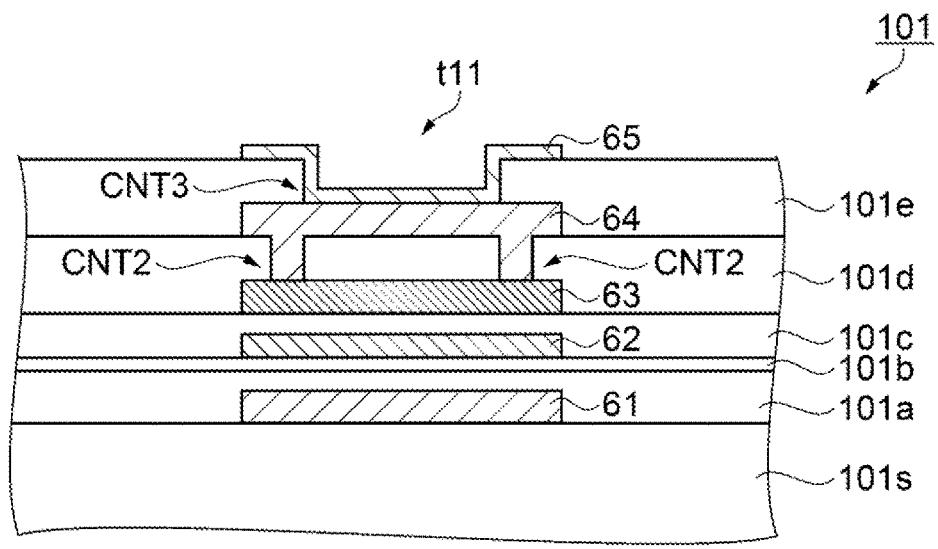
FIG. 14 is a schematic cross-sectional view illustrating a wiring structure of a terminal.
Figure 15:
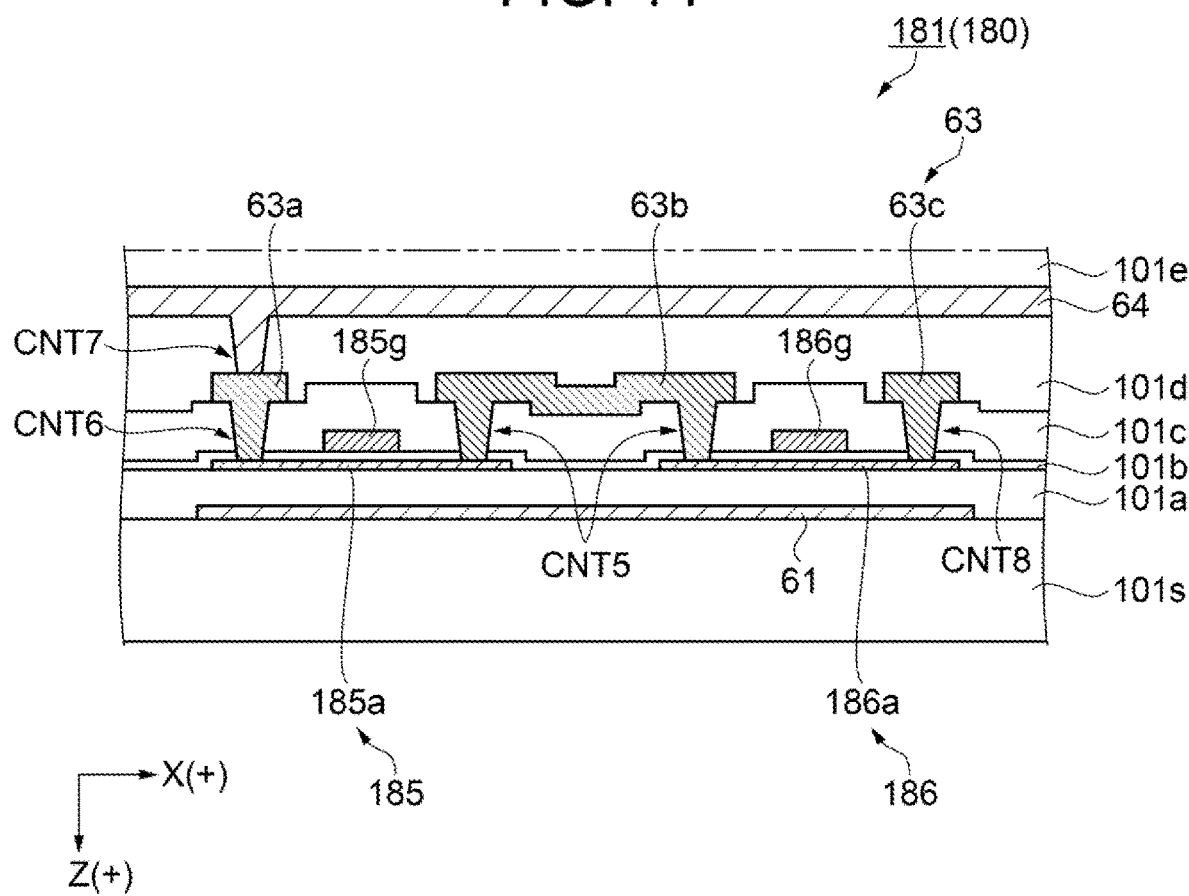
FIG. 15 is a schematic cross-sectional view illustrating a wiring structure relating to the transistor of the electrostatic protection circuit.

FIG. 11 is a schematic plan view illustrating an arrangement of the video signal lines and the electrostatic protection circuit of Example 5 of Embodiment 2. FIG. 12 is a circuit diagram illustrating an example of an electrical configuration of the electrostatic protection circuit. FIG. 13 is a schematic plan view illustrating an arrangement of transistors of the electrostatic protection circuit of Example 5. FIG. 14 is a schematic cross-sectional view illustrating a wiring structure of the terminal, and FIG. 15 is a schematic cross-sectional view illustrating a wiring structure relating to the transistors of the electrostatic protection circuit. In Example 5, the electrostatic protection circuit is provided on the video signal line of Example 3 illustrated in Embodiment 1 described above. Thus, the same reference signs are assigned to the same configuration as that of Example 3, and a detailed description thereof is omitted.

As illustrated in FIG. 11, in Example 5, the first video signal line 165E is electrically coupled to the terminal t11 as the first terminal of the first terminal group 161. Further, the second video signal line 166E is electrically coupled to the terminal t21 as the second terminal of the second terminal group 162. Similarly, the first video signal line 165E is electrically coupled to the terminal t12 as the first terminal of the first terminal group 161. Further, the second video signal line 166E is electrically coupled to the terminal t22 as the second terminal of the second terminal group 162.

The first video signal line 165E includes the first portion 165a extending from the terminal t11 toward the second terminal group 162 side, that is, in the positive Y direction, and the second portion 165b that extends from the first portion 165a in a direction diagonally intersecting the first portion 165a at 45 degrees, the third portion 165c that extends from the second portion 165b in the negative Y direction to the data line selection circuit 150 side, and a first extending portion 165d that extends from the third portion 165c in the positive Y direction that is on the opposite side from the data line selection circuit 150. The third portion 165c extends in the negative Y direction along the long side of the terminal t11, on the positive X direction side, and the first extending portion 165d extends in the positive Y direction along the long side of the terminal t21, on the positive X direction side.

The second video signal line 166E includes the fourth portion 166a that extends from the terminal t21 toward the first terminal group 161 side, that is, in the negative Y direction, the fifth portion 166b that extends from the fourth portion 166a in the direction intersecting the fourth portion 166a diagonally at 45 degrees, and extends in parallel with the second portion 165b of the first video signal line 165E, the sixth portion 166c that extends from the fifth portion 166b in the negative Y direction to the data line selection circuit 150 side, and the second extended portion 166d that extends from the sixth portion 166c in the positive Y direction that is on the opposite side to the data line selection circuit 150. The sixth portion 166c extends in the negative Y direction along the long side of the terminal t11, on the negative X direction side, and the second extending portion 166d extends in the positive Y direction along the long side of the terminal t21, on the negative X direction side. The third portion 165c of the first video signal line 165E and the sixth portion 166c of the second video signal line 166E extend in parallel to each other between the terminal t11 and the terminal t12 adjacent to each other in the X direction. Further, the first extending portion 165d of the first video signal line 165E and the second extending portion 166d of the second video signal line 166E extend in parallel to each other between the terminal t21 and the terminal t22 adjacent to each other in the X direction.

The first video signal lines 165E and the second video signal lines 166E are formed in the same wiring layer with the same line width. The first portion 165a of the first video signal line 165E and the fourth portion 166a of the second video signal line 166E are the same length. The second portion 165b of the first video signal line 165E and the fifth portion 166b of the second video signal line 166E are the same length. The third portion 165c of the first video signal line 165E and the sixth portion 166c of the second video signal line 166E are the same length. The first extending portion 165d of the first video signal line 165E and the second extending portion 166d of the second video signal line 166E are the same length. In other words, the first video signal line 165E and the second video signal line 166E are the same length.

Note that the bundle of the first video signal lines 165E from the third portion 165c toward the data line selection circuit 150 may be diagonal wiring rather than a simple straight line. Similarly, the bundle of the second video signal lines 166E from the sixth portion 166c toward the data line selection circuit 150 may be diagonal wiring following the first video signal lines 165E rather than a simple straight line.

Further, the end portions on the positive Y direction side of the first extending portion 165d of the first video signal line 165E and the second extending portion 166d of the second video signal line 166E may reach the one side 105a of the terminal portion 105, or may be configured to be coupled to a test signal line, or a guard ring for suppressing electrostatic breakdown (both not illustrated).

As illustrated in FIG. 11, in ranges indicated by dashed lines in the vicinity of each of the terminals t11, t12, t21, and t22, first electrostatic protection circuits 181 are provided that are electrically coupled to the first portions 165a of the first video signal lines 165E. Similarly, second electrostatic protection circuits 182 are provided that are electrically coupled to the fourth portions 166a of the second video signal lines 166E. Since the first electrostatic protection circuit 181 and the second electrostatic protection circuit 182 have the same electrical configuration, each is sometimes referred to as an electrostatic protection circuit 180. The electrostatic protection circuit 180 is disposed between the first terminal group 161 and the second terminal group 162 in the Y direction. Because the electrostatic protection circuit 180 is provided on each of the first video signal line 165E and the second video signal line 166E, even when static electricity enters each of the first terminal of the first terminal group 161 and the second terminal of the second terminal group 162, damage to each of the first video signal line 165E and the second video signal line 166E as a result of the static electricity is prevented.

As illustrated in FIG. 12, the first electrostatic protection circuit 181 (the electrostatic protection circuit 180) is configured to include a resistive element R1 electrically coupled to the terminal t11, a P-type transistor 185, and an N-type transistor 186. In this embodiment, the P-type transistor 185 and the N-type transistor 186 are both thin film transistors (TFT) provided on the element substrate 101, and are hereinafter abbreviated as P-TFT 185, and N-TFT 186. Note that the P-type transistor 185 and the N-type transistor 186 are not limited to being TFTs.

The resistive element R1 is provided between the terminal t11 and the first portion 165a of the first video signal line 165E. The P-TFT 185 is provided between power source wiring 183 to which VDD is supplied and the first portion 165a of the first video signal line 165E. A gate electrode 185g and a source electrode 185s of the P-TFT 185 are electrically coupled to the power source wiring 183. A drain electrode 185d of the P-TFT 185 is electrically coupled to the first portion 165a of the first video signal line 165E.

On the other hand, the N-TFT 186 is provided between power source wiring 184 to which VSS (GND) is supplied and the first portion 165a of the first video signal line 165E. A gate electrode 186g and a source electrode 186s of the N-TFT 186 are electrically coupled to the power source wiring 184. A drain electrode 186d of the N-TFT 186 is electrically coupled to the first portion 165a of the first video signal line 165E.

According to such a configuration of the first electrostatic protection circuit 181, when a potential greater than VDD, where a potential of VSS (GND) is a reference, that is, when positive potential static electricity enters the terminal t11, the static electricity is attenuated by the resistive element R1 and then grounded to the power source wiring line 183 via the P-TFT 185. Further, when a potential lower than VSS (GND), that is, negative potential static electricity enters the terminal t11, the static electricity is attenuated by the resistive element R1, and then grounded to the power source wiring line 184 via the N-TFT 186. In other words, since the static electricity that has entered the terminal t11 is attenuated by the resistive element R1, and is then guided to the power source wiring 183 or the power source wiring 184, it is possible to prevent damage to the first video signal line 165E caused by the static electricity. Further, the static electricity does not reach the pixels 111 (see FIG. 5) in the display region 110 via the first video signal line 165E. The electrical configuration of the second electrostatic protection circuit 182 electrically coupled to the fourth portion 166a of the second video signal line 166E is also the same as the electrical configuration of the first electrostatic protection circuit 181.

FIG. 13 is a plan view specifically illustrating the arrangement of the electrical configuration of the first static protection circuit 181 electrically coupled to the terminal t11 of the first terminal group 161 and the second electrostatic protection circuit 182 electrically coupled to the terminal t21 of the second terminal group 162. Note that, for the purpose of illustration, the shape of the rectangular terminal t11 and the terminal t21, which are long in the Y direction in actuality, is displayed in a contracted manner.

As illustrated in FIG. 13, the third portion 165c and the first extending portion 165d of the first video signal line 165E, and the sixth portion 166c and the second extending portion 166d of the second video signal line 166E are disposed in parallel with each other and with an interval therebetween in the X direction. The resistive element R1 of the first electrostatic protection circuit 181, the P-TFT 185, and the N-TFT 186 are disposed between the third portion 165c and the sixth portion 166c. Further, the resistive element R1 of the second electrostatic protection circuit 182, the P-TFT 185, and the N-TFT 186 are disposed between the first extending portion 165d and the second extending portion 166d. The resistive element R1 realizes a predetermined electrical resistance by meandering the wiring in a planar manner. An electrical resistance value of the resistive element R1 is approximately 0.5 kΩ to 5 kΩ, depending on the capacitance value of a protected node, and is, for example, 2 kΩ. In the first electrostatic protection circuit 181, one end of the meandering wiring is electrically coupled to the terminal t11 via a contact portion CNT1 and a contact portion CNT2. Further, the other end of the meander wiring is electrically coupled to the first portion 165a via a contact portion CNT4. In the second electrostatic protection circuit 182, one end of the meander wiring is electrically coupled to the terminal t21 via the contact portion CNT1 and the contact portion CNT2. Further, the other end of the meander wiring is electrically coupled to the fourth portion 166a via the contact portion CNT4. Note that each of the terminal t11 and the terminal t12 is electrically coupled, via a contact portion CNT3, to the wiring layer positioned in a lower layer.

When a virtual center line CL2 extending in the Y direction is provided between the third portion 165c and the sixth portion 166c arranged with a predetermined interval therebetween in the X direction, the first portion 165a and the fourth portion 166a are disposed on the center line CL2. The second portion 165b extends in the direction diagonally intersecting the first portion 165a at 45 degrees, and is electrically coupled to the third portion 165c and the first extending portion 165d at the coupling point C. The fifth portion 166b extends in the direction diagonally intersecting the fourth portion 166a at 45 degrees, and is electrically coupled to the sixth portion 166c and the second extending portion 166d at the coupling point G. The coupling point C and the coupling point G are disposed on the virtual center line CL1 extending in the X direction.

In the first electrostatic protection circuit 181, the P-TFT 185 is disposed on the sixth portion 166c side between the third portion 165c and the sixth portion 166c, and the N-TFT 186 is disposed on the third portion 165c side. The power source wiring line 183 and the power source wiring line 184 extend in the X direction, with a predetermined interval therebetween in the Y direction, on either side of the P-TFT 185 and the N-TFT 186. The power source wiring line 184 to which VSS (GND) is supplied is disposed on the terminal t11 side. The source electrode 185s and the gate electrode 185g of the P-TFT 185 are electrically coupled to the power source wiring line 183 via a contact portion CNT6 and a contact portion CNT7. The source electrode 186s and the gate electrode 186g of the N-TF186 are electrically coupled to the power source wiring line 184 via a contact portion CNT8 and a contact portion CNT9. The drain electrode 185d of the P-TFT 185, and the drain electrode 186d of the N-TFT 186 are electrically coupled to the first portion 165a of the first video signal line 165E via a contact portion CNT5.

Such an arrangement of the P-TFT 185 and the N-TFT 186 is the same in the second electrostatic protection circuit 182 electrically coupled to the terminal t21. Specifically, in the second electrostatic protection circuit 182, the P-TFT 185 is disposed on the first extending portion 165d side between the first extending portion 165d and the second extending portion 166d, and the N-TFT 186 is disposed on the second extending portion 166d side. The power source wiring line 183 and the power source wiring line 184 extend in the X direction, at the predetermined interval in the Y direction, on either side of the P-TFT 185 and the N-TFT 186. The power source wiring line 184 to which VSS (GND)

is supplied is disposed on the terminal t21 side. The source electrode 185s and the gate electrode 185g of the P-TFT 185 are electrically coupled to the power source wiring line 183 via a contact portion CNT6 and a contact portion CNT7. The source electrode 186s and the gate electrode 186g of the N-TF186 are electrically coupled to the power source wiring line 184 via a contact portion CNT8 and a contact portion CNT9. The drain electrodes 185d of the P-TFT 185, and the drain electrode 186d of the N-TFT 186 are electrically coupled to the fourth portion 166a of the second video signal line 166E via the contact portion CNT5.

In this embodiment, a plurality of each of the contact portions CNT1, CNT2, CNT4, CNT5, CNT6, CNT7, CNT8, and CNT9 are provided in order to secure the reliability of the electrical coupling. In particular, it is preferable to provide the plurality of contact portions CNT7 and CNT9 for the electrical coupling with the power source wiring lines 183 and 184.

As illustrated in FIG. 14, a first wiring layer 61, a first insulating layer 101a, a gate insulation layer 101b, a second wiring layer 62, a second insulating layer 101c, a third wiring layer 63, a third insulating layer 101d, a fourth wiring layer 64, a fourth insulating layer 101e, and a fifth wiring layer 65 are provided in this order on a substrate 101s of the element substrate 101. A metal such as tungsten or a wiring material such as a silicide of the metal, for example, is used for the first wiring layer 61 that functions as a light shielding layer. A wiring material, such as conductive polysilicon, for example, which configures the gate electrode and the resistive element R1, is used for the second wiring layer 62. A low-resistance wiring material, such as aluminum or titanium, for example, which configures the first video signal line 165E and the second video signal line 166E, is used for the third wiring layer 63. A low-resistance wiring material, such as aluminum or titanium, for example, which configures the power source wiring 183 and 184, is used as the fourth wiring layer 64. A transparent conductive material, such as ITO or IZO, for example, which configures the pixel electrode, is used as the fifth wiring layer 65. The first insulating layer 101a, the gate insulation layer 101b, the second insulating layer 101c, the third insulating layer 101d, and the fourth insulating layer 101e are formed using an insulating material such as silicon oxide or silicon nitride, for example.

The terminal t11 as the first terminal of the first terminal group 161 is configured by the third wiring layer 63, the fourth wiring layer 64, and the fifth wiring layer 65. In the terminal t11, the third wiring layer 63 and the fourth wiring layer 64 are electrically coupled via the plurality of contact portions CNT2 that penetrate the third insulating layer 101d, and the fourth wiring layer 64 and the fifth wiring layer 65 are electrically coupled via the contact portion CNT3 that penetrates the fourth insulating layer 101e. The wiring structure of the terminal t21 as the second terminal of the second terminal group 162 is the same as that of the terminal t11 as the first terminal of the first terminal group 161. Note that in the terminal structure, the terminal t11 is not coupled to the second wiring layer 62, but a separate contact portion may be provided to electrically couple the second wiring layer 62 and the third wiring layer 63.

As illustrated in FIG. 15, a semiconductor layer 185a of the P-TFT 185 and a semiconductor layer 186a of the N-TFT 186 of the first electrostatic protection circuit 181 are each independently formed in islands on the first insulating layer 101a. The semiconductor layer 185a and the semiconductor layer 186a are formed using polysilicon, for example, and are configured to include a low concentration impurity region and a high concentration impurity region formed by selective injection of P-type or N-type impurity ions. The first wiring layer 61 is provided on the substrate 101s. The first wiring layer 61 is disposed so as to overlap with the semiconductor layer 185a and the semiconductor layer 186a in plan view.

The gate electrode 185g is provided at a position facing a channel region, which is the low concentration impurity region of the semiconductor layer 185a, with the gate insulation layer 101b interposed therebetween. Similarly, the gate electrode 186g is provided at a position facing a channel region, which is the low concentration impurity region of the semiconductor layer 186a, with the gate insulation layer 101b interposed therebetween.

The second insulating layer 101c is provided covering the gate electrodes 185g and 186g and the gate insulation layer 101b. A through hole is formed in the second insulating layer 101c at a position overlapping with a source region, which is the high concentration impurity region of the semiconductor layer 185a, wiring 63a is formed so as to fill the through hole, and the contact portion CNT6 is configured, by the wiring 63a, to function as the source electrode 185s of the P-TFT 185. A through hole is formed in the second insulating layer 101c at a position overlapping with a source region, which is the high concentration impurity region of the semiconductor layer 186a, wiring 63c is formed so as to fill the through hole, and the contact portion CNT8 is configured, by the wiring 63c, to function as the source electrode 186s of the N-TFT 186. Through holes are formed in the second insulating layer 101c at positions overlapping with a drain region that is the high concentration impurity region of the semiconductor layer 185a, and a drain region that is the high concentration impurity region of the semiconductor layer 186a, and wiring 63b is formed so as to fill the two through holes. The wiring 63b configures the contact portion CNT5 that functions as the drain electrode 185d of the P-TFT 185 and the drain electrode 186d of the N-TFT 186, and a portion that functions as the first portion 165a of the first video signal line 165E. The wiring 63a, 63b, and 63c is included in the third wiring layer 63. The third insulating layer 101d is formed covering the wiring 63a, 63b, and 63c and the second insulating layer 101c, and the fourth wiring layer 64 is formed on the third insulating layer 101d. The fourth wiring layer 64 includes the power source wiring 183 and 184, and, via the contact portion CNT7 that penetrates the third insulating layer 101d so as to reach the wiring 63a, the power source wiring line 183 is electrically coupled to the wiring 63a that functions as the source electrode 185s of the P-TFT 185. Note that, although not illustrated, the gate electrode 185g provided on the second wiring layer 62, and the wiring to which VDD is supplied and which is provided on the third wiring layer 63 are electrically coupled by contact portions formed at the same time at which the contact portions CNT6 are formed. The gate electrode 186g provided on the second wiring layer 62, and the wiring to which VSS is supplied and which is provided on the third wiring layer 63 are electrically coupled by contact portions formed at the same time at which the contact portions CNT8 are formed.

Such an arrangement of the wiring layers, the P-TFT 185 and the N-TFT 186 on the substrate 101s is the same in the second electrostatic protection circuit 182.

2-1-6. Example 6

Figure 16:
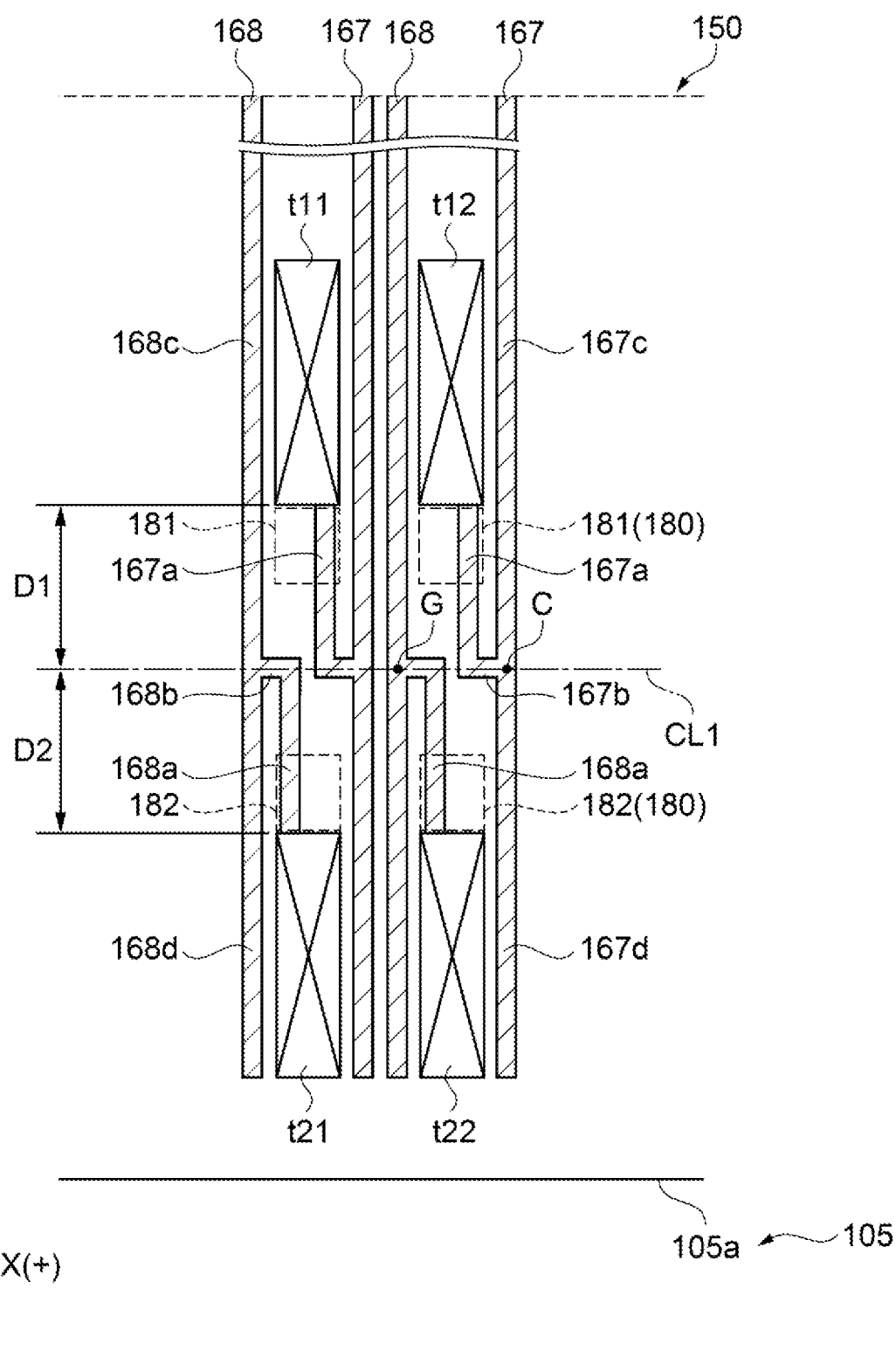
FIG. 16 is a schematic plan view illustrating an arrangement of the video signal lines and the electrostatic protection circuits according to Example 6 of Embodiment 2.
Figure 17:
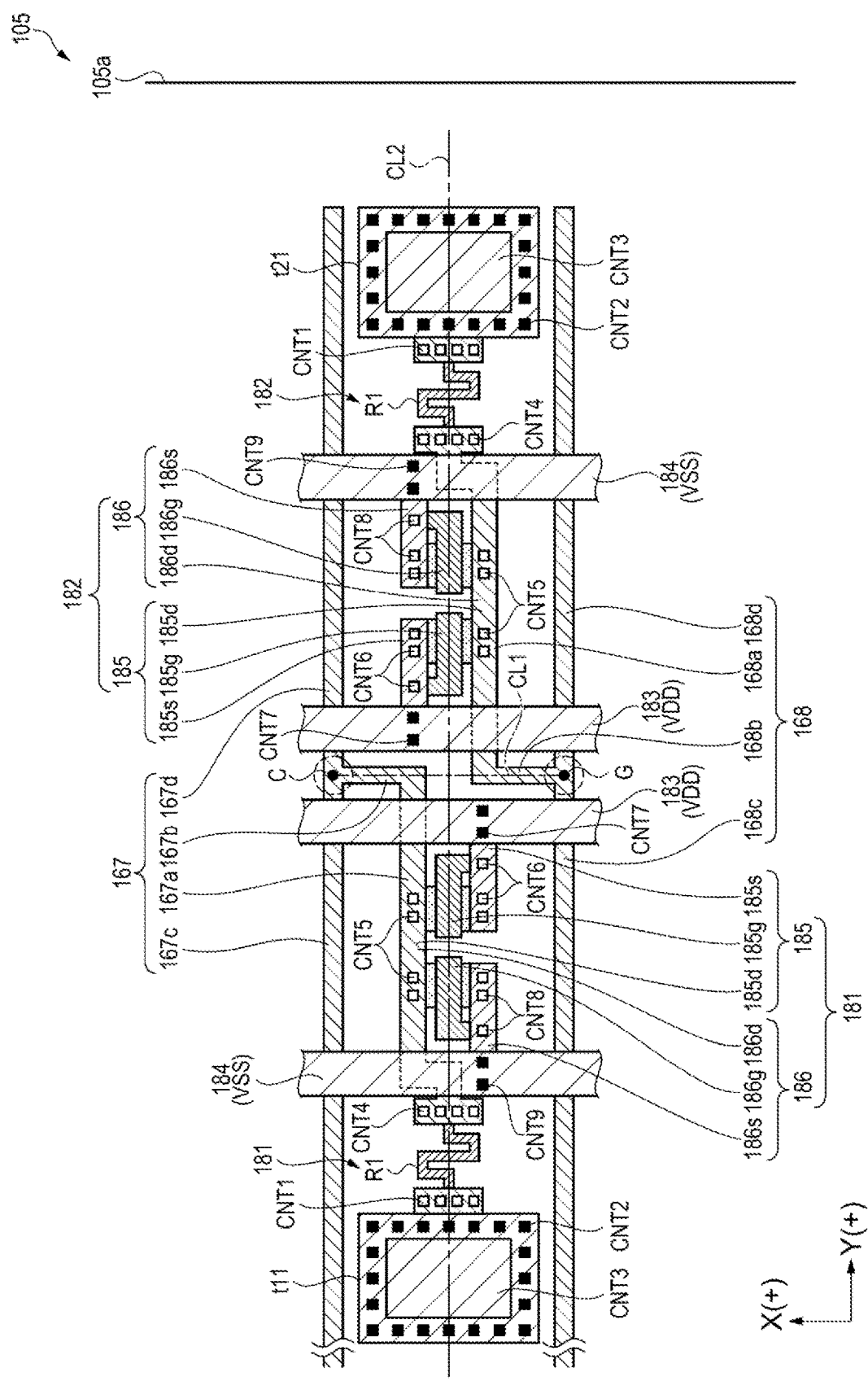
FIG. 17 is a schematic plan view illustrating an arrangement of transistors of the electrostatic protection circuit according to Example 6.

FIG. 16 is a schematic plan view illustrating an arrangement of the video signal lines and an electrostatic protection circuit according to Example 6 of Embodiment 2. FIG. 17 is a schematic plan view illustrating an arrangement of transistors of the electrostatic protection circuit according to Example 6. In Example 6, the electrostatic protection circuit is provided on the video signal line of Example 4 illustrated in Embodiment 1 described above. Thus, the same reference signs are assigned to the same configuration as that of Example 4, and a detailed description thereof is omitted.

As illustrated in FIG. 16, in Example 6, the first video signal line 167 is electrically coupled to the terminal t11 of the first terminal group 161. Further, a second video signal line 168 is electrically coupled to the terminal t21 of the second terminal group 162. Similarly, the first video signal line 167 is electrically coupled to the terminal t12 of the first terminal group 161. Further, the second video signal line 168 is electrically coupled to the terminal t22 of the second terminal group 162.

The first video signal line 167 includes the first portion 167a that extends from the terminal t11 toward the second terminal group 162 side, that is, in the positive Y direction, the second portion 167b that extends in the positive X direction from the first portion 167a so as to intersect the first portion 167a, the third portion 167c that extends from the second portion 167b in the negative Y direction toward the data line selection circuit 150 side, and the first extending portion 167d that extends from the third portion 167c in the positive Y direction that is on the side opposite to the data line selection circuit 150. The third portion 167c extends in the negative Y direction along the long side of the terminal t11, on the positive X direction side, and the first extending portion 167d extends in the positive Y direction along the long side of the terminal t21, on the positive X direction side.

The second video signal line 168 includes the fourth portion 168a that extends from the terminal t21 toward the first terminal group 161 side, that is, in the negative Y direction, the fifth portion 168b that extends from the fourth portion 168a in the negative X direction that intersects the fourth portion 168a and is the direction opposite to the second portion 167b of the first video signal line 167, the sixth portion 168c that extends from the fifth portion 168b in the negative Y direction toward the data line selection circuit 150 side, and the second extending portion 168d that extends from the sixth portion 168c in the positive Y direction on the side opposite to the data line selection circuit 150. The sixth portion 168c extends in the negative Y direction along the long side of the terminal t11, on the negative X direction side, and the second extending portion 168d extends in the positive Y direction along the long side of the terminal t21, on the negative X direction side. The third portion 167c of the first video signal line 167 and the sixth portion 168c of the second video signal line 168 extend in parallel to each other between the terminal t11 and the terminal t12 adjacent to each other in the X direction. Further, the first extending portion 167d of the first video signal line 167 and the second extending portion 168d of the second video signal line 168 extend in parallel to each other between the terminal t21 and the terminal t22 adjacent to each other in the X direction.

The second portion 167b of the first video signal line 167 and the fifth portion 168b of the second video signal line 168 are positioned on the virtual center line CL1 extending in the X direction. The coupling point C between the second portion 167b, the third portion 167c, and the first extending portion 167d of the first video signal line 167, and the coupling point G between the fifth portion 168b, the sixth portion 168c, and the second extending portion 168d of the second video signal line 168 are positioned on the virtual center line CL1 extending in the X direction.

The first video signal line 167 and the second video signal line 168 are formed in the same wiring layer with the same line width. The first portion 167a of the first video signal line 167 and the fourth portion 168a of the second video signal line 168 are the same length. The second portion 167b of the first video signal line 167 and the fifth portion 168b of the second video signal line 168 are the same length. The third portion 167c of the first video signal line 167 and the sixth portion 168c of the second video signal line 168 are the same length. The first extending portion 167d of the first video signal line 167 and the second extending portion 168d of the second video signal line 168 are the same length. In other words, the first video signal line 167 and the second video signal line 168 are the same length.

Note that a bundle of the first video signal lines 167 from the third portion 167c toward the data line selection circuit 150 may be diagonal wiring rather than a simple straight line. Similarly, a bundle of the second video signal lines 168 from the sixth portion 168c toward the data line selection circuit 150 may be diagonal wiring following the first video signal lines 167 rather than a simple straight line.

Further, the end portions, in the Y direction, of the first extending portion 167d of the first video signal line 167 and of the second extending portion 168d of the second video signal line 168 may reach the one side 105a of the terminal portion 105, or may be configured to be coupled to a test signal line or a guard ring for suppressing electrostatic breakdown (both not illustrated).

As illustrated in FIG. 16, of ranges indicated by dashed lines in the vicinity of each of the terminals t11, t12, t21, and t22, the first electrostatic protection circuit 181 is provided that is electrically coupled to the first portion 167a of the first video signal line 167. Similarly, the second electrostatic protection circuit 182 is provided that is electrically coupled to the fourth portion 168a of the second video signal line 168. The first electrostatic protection circuit 181 and the second electrostatic protection circuit 182 have the same electrical configuration.

FIG. 17 is a plan view specifically illustrating an arrangement of the electrical configuration of the first static protection circuit 181 electrically coupled to the terminal t11 of the first terminal group 161 and the second electrostatic protection circuit 182 electrically coupled to the terminal t21 of the second terminal group 162 in Example 6. Note that, for the purpose of illustration, the shape of the rectangular terminal t11 and the terminal t21, which are long in the Y direction in actuality, is displayed in a contracted manner.

As illustrated in FIG. 17, the third portion 167c and the first extending portion 167d of the first video signal line 167, and the sixth portion 168c and the second extending portion 168d of the second video signal line 168 are disposed in parallel with each other and with an interval therebetween in the X direction. The resistive element R1 of the first electrostatic protection circuit 181, the P-TFT 185, and the N-TFT 186 are disposed on the virtual center line CL2 between the third portion 167c and the sixth portion 168c. Further, the resistive element R1 of the second electrostatic protection circuit 182, the P-TFT 185, and the N-TFT 186 are disposed on the virtual center line CL2 between the first extending portion 167d and the second extending portion 168d. The resistive element R1 realizes a predetermined electrical resistance by meandering the wiring in a planar manner. In the first electrostatic protection circuit 181, one end of the meandering wiring is electrically coupled to the terminal t11 via a contact portion CNT1 and a contact portion CNT2. Further, the other end of the meander wiring is electrically coupled to the first portion 167*a* via the contact portion CNT4. In the second electrostatic protection circuit 182, one end of the meander wiring is electrically coupled to the terminal t21 via the contact portion CNT1 and the contact portion CNT2. Further, the other end of the meander wiring is electrically coupled to the fourth portion 166*a* via the contact portion CNT4. Note that each of the terminal t11 and the terminal t12 is electrically coupled, via the contact portion CNT3, to the wiring layer positioned in a lower layer.

The first portion 167*a* of the first video signal line 167 and the fourth portion 168*a* of the second video signal line 168 are respectively disposed along the center line CL2 extending in the Y direction. The second portion 167*b* of the first video signal line 167 extends orthogonally to the first portion 167*a* in the positive X direction, and is electrically coupled to the third portion 167*c* and the first extending portion 167*d* at the coupling point C. The fifth portion 168*b* of the second video signal line 168 extends orthogonally to the fourth portion 168*a* in the negative X direction, and is electrically coupled to the sixth portion 168*c* and the second extending portion 168*d* at the coupling point G. The second portion 167*b* and the fifth portion 168*b* are disposed on the virtual center line CL1 extending in the X direction.

In the first electrostatic protection circuit 181, the power source wiring 183 and the power source wiring line 184 extend in the X direction, with a predetermined interval therebetween in the Y direction, between the third portion 167*c* and the sixth portion 168*c*. The power source wiring line 184 to which VSS (GND) is supplied is disposed on the terminal t11 side. Further, between the power source wiring line 183 and the power source wiring line 184, the P-TFT 185 is disposed on the power source wiring line 183 side and the N-TFT 186 is disposed on the power source wiring line 184 side. The source electrode 185*s* and the gate electrode 185*g* of the P-TFT 185 are electrically coupled to the power source wiring line 183 via the contact portion CNT6 and the contact portion CNT7. The source electrode 186*s* and the gate electrode 186*g* of the N-TF186 are electrically coupled to the power source wiring line 184 via the contact portion CNT8 and the contact portion CNT9. The drain electrode 185*d* of the P-TFT 185 and the drain electrode 186*d* of the N-TFT 186 are electrically coupled to the first portion 167*a* of the first video signal line 167 via the contact portion CNT5.

Such an arrangement of the P-TFT 185 and the N-TFT 186 is the same in the second electrostatic protection circuit 182 electrically coupled to the terminal t21. Specifically, in the second electrostatic protection circuit 182, the power source wiring 183 and the power source wiring line 184 extend in the X direction, with a predetermined interval therebetween in the Y direction, between the first extending portion 167*d* and the second extending portion 168*d*. The power source wiring line 184 to which VSS (GND) is supplied is disposed on the terminal t21 side. Further, between the power source wiring line 183 and the power source wiring line 184, the P-TFT 185 is disposed on the power source wiring line 183 side and the N-TFT 186 is disposed on the power source wiring line 184 side. The source electrode 185*s* and the gate electrode 185*g* of the P-TFT 185 are electrically coupled to the power source wiring line 183 via the contact portion CNT6 and the contact portion CNT7. The source electrode 186*s* and the gate electrode 186*g* of the N-TF186 are electrically coupled to the power source wiring line 184 via the contact portion CNT8 and the contact portion CNT9. The drain electrode 185*d* of the P-TFT 185 and the drain electrode 186*d* of the N-TFT 186 are electrically coupled to the fourth portion 168*a* of the second video signal line 168 via the contact portion CNT5.

In Example 6, in comparison to Example 5, a distance between the two power source lines 183 that are adjacent to each other on either side of the virtual center line CL1 extending in the X direction, can be narrowed. As a result, the Y direction interval between the power source wiring 183 and the power source wiring 184 can be widened, and the P-TFT 185 and the N-TFT 186 can be disposed on the center line CL2 extending in the Y direction between the power source wiring 183 and the power source wiring line 184. Therefore, in Example 6, an interval between the P-TFT 185 and the N-TFT 186 of the first electrostatic protection circuit 181 and the third portion 167*c* and the sixth portion 168*c* can be widened, and an interval between the P-TFT 185 and the N-TFT 186 of the second electrostatic protection circuit 182 and the first extending portion 167*d* and the second extending portion 168*d* can be widened. Therefore, static electricity that enters the terminal t11 and flows through the first electrostatic protection circuit 181 is less likely to leak to other wiring on the way, and the static electricity can be reliably led to the power source wiring 183 and 184. Similarly, static electricity that enters the terminal t21 and flows through the second electrostatic protection circuit 182 is less likely to leak to other wiring on the way, and the static electricity can be reliably guided to the power source wiring 183 and 184. Further, since the P-TFT 185 and the N-TFT 186 are arranged on the center line CL2, in comparison to the case in which the two transistors are disposed in the X direction, as in Example 5, even if the plurality of terminals are arranged at a narrow pitch in the X direction in the first terminal group 161 and the second terminal group 162, the first electrostatic protection circuit 181 and the second electrostatic protection circuit 182 can be provided.

Note that the electrostatic protection circuit 180 of Example 5 or Example 6 described above can also be applied to the video signal lines in Example 1 and Example 2 illustrated in Embodiment 1.

According to the liquid crystal device of Embodiment 2 described above, in addition to the effects (1), (2), and (4) of Embodiment 1 described above, the following effects can be obtained.

(5) The first electrostatic protection circuit 181 is electrically coupled to the first portion of the first video signal line, and the second electrostatic protection circuit 182 is electrically coupled to the fourth portion of the second video signal line. Therefore, after the static electricity that has entered the first terminal of the first terminal group 161 or the second terminal of the second terminal group 162 is attenuated by the resistive element R1, the static electricity is grounded to the power source wiring 183 or the power source wiring line 184 via the P-TFT 185 or the N-TFT 186. In other words, damage to the first video signal line caused by static electricity entering the first terminal, or damage to the second video signal line caused by static electricity entering the second terminal can be prevented.

(6) Since the first electrostatic protection circuit 181 and the second electrostatic protection circuit 182 are disposed between the first terminal group 161 and the second terminal group 162 in the Y direction, a surface area of the terminal portion 105 of the element substrate 101 can be reduced, in comparison to a case in which the first electrostatic protection circuit 181 is disposed between the data line selection circuit 150 and the first terminal group 161. In other words, even when the electrostatic protection circuit 180 is provided on each of the video signal lines, the small liquid crystal device can be realized.

3. Embodiment 3

3-1. Electronic Apparatus

Figure 18:
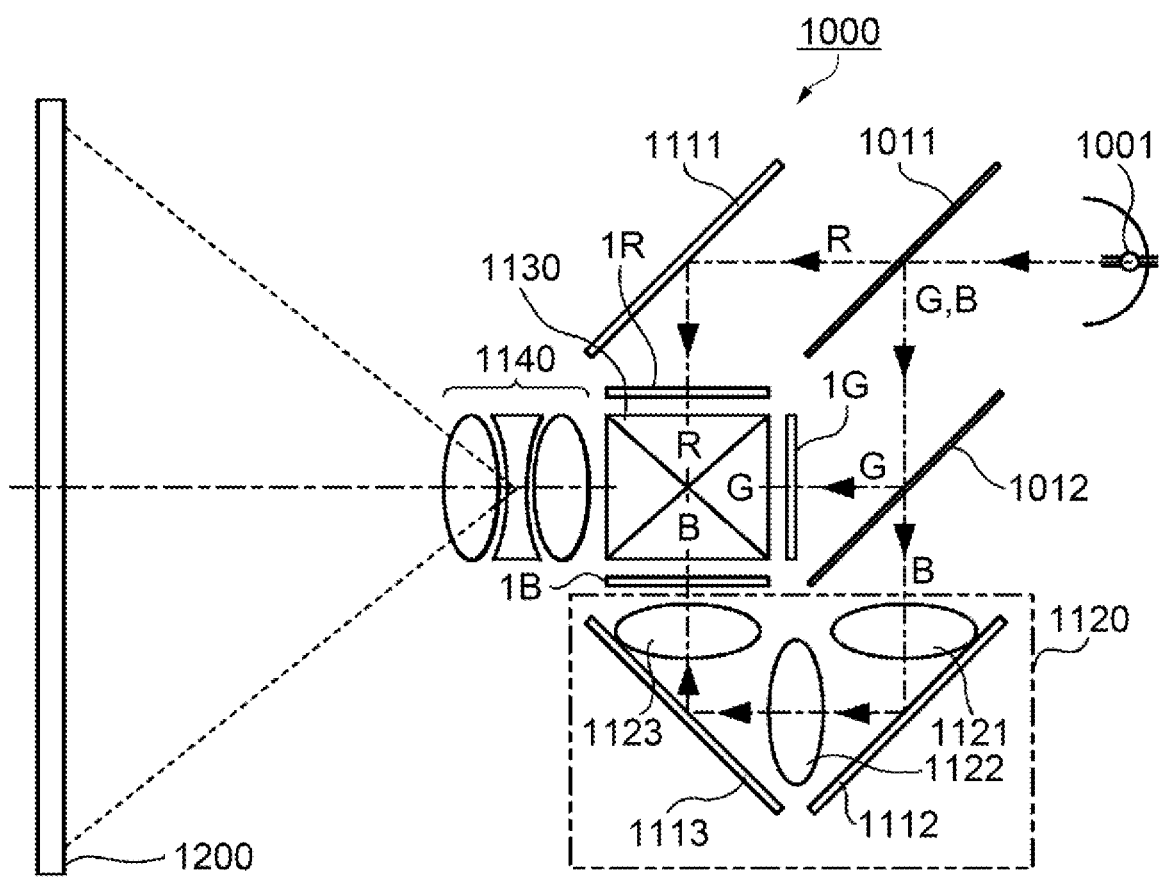
FIG. 18 is a schematic view illustrating a configuration of a projection-type display device as an electronic apparatus according to Embodiment 3.

Next, an electronic apparatus of this embodiment will be described using a projection-type display device as an example, with reference to FIG. 18. FIG. 18 is a schematic view illustrating a configuration of a projection-type display device as the electronic apparatus according to Embodiment 3.

As illustrated in FIG. 18, a projection-type display device 1000 as the electronic apparatus according to this embodiment is provided with a lamp unit 1001 as a light source, dichroic mirrors 1011 and 1012 as a color light separation unit, liquid crystal devices 1B, 1G, and 1R as three light modulating devices, three reflective mirrors 1111, 1112, and 1113, three relay lenses 1121, 1122, and 1123, a dichroic prism 1130 as a color synthesis device, and a projection lens group 1140 as a projection optical system.

The lamp unit 1001 is a light source such as an ultra high pressure mercury lamp, for example, that emits white light along a system optical axis. The white light emitted from the lamp unit 1001 is separated into red (R), green (G), and blue (B) color light by the internally disposed two dichroic mirrors 1011 and 1012. Specifically, of the white light incident on the dichroic mirror 1011, the red light (R) passes through the dichroic mirror 1011, and the green light (G) and the blue light (B) having a wavelength shorter than the red light (R) are reflected. The reflected green light (G) and blue light (B) are incident on the dichroic mirror 1012. Of the blue light (B) and the green light (G) incident on the dichroic mirror 1012, the blue light (B) having a shorter wavelength passes through the dichroic mirror 1012, and the green light (G) having a longer wavelength is reflected. Of the separated color light, the red light (R) is reflected by the reflective mirror 1111 and is guided to the liquid crystal device 1R corresponding to the color light. The green light (G) reflected by the dichroic mirror 1012 is incident on the liquid crystal device 1G corresponding to the color light. The blue light (B) that has passed through the dichroic mirror 1012 is guided to the liquid crystal device 1B corresponding to the color light, via a relay lens system 1120 including the two reflective mirrors 1112 and 1113 and the three relay lenses 1121, 1122, and 1123 Note that the blue light (B) is guided via the relay lens system 1120 in order to prevent loss of the blue light (B), because the optical path is thereof is longer than that of the red light (R) and the green light (G).

In the projection-type display device 1000, the liquid crystal device 1 of Embodiment 1 described above is employed as the liquid crystal devices 1B, 1G, and 1R serving as the light modulating devices. Each of the liquid crystal devices 1B, 1G, and 1R is coupled to a higher circuit in the projection-type display device 1000 via the first extension substrate 41 and the second extension substrate 42. Video signals specifying the gray-scale level of the color light component of each of the red light (R), the green light (G), and the blue light (B) are respectively supplied from an external circuit, are processed by the higher circuit in the projection-type display device 1000, and the liquid crystal devices 1B, 1G, and 1R are respectively driven. The light modulated by each of the liquid crystal devices 1B, 1G, and 1R is incident on the dichroic prism 1130 from three directions. Then, in the dichroic prism 1130, the modulated red light (R) and blue light (B) are reflected at 90 degrees, and the modulated green light (G) passes through. Thus, after an image of each of the color lights is synthesized by the dichroic prism 1130, the image is magnified by the projection lens group 1140, and a color image is projected onto a screen 1200.

Since the liquid crystal device 1 according to Embodiment 1 is used as the light modulating device, the projection-type display device 1000 having good display quality is realized, in which display unevenness caused by differences in the electrical properties of the video signal lines electrically coupled to the respective terminals of the first terminal group 161 and the second terminal group 162 is unlikely to occur.

Note that the liquid crystal device of Embodiment 2 may also be used as the light modulating device. Further, the projection-type display device 1000 may be configured to use, as a light source, an LED light source or the like that emits light of each of colors, and each of the color lights emitted from the LED light source may be supplied to a separate light modulating device.

An electronic apparatus provided with the liquid crystal device 1 as the electro-optical device to which the present disclosure is applied is not limited to the projection-type display device 1000 of Embodiment 3 described above. Examples of the electronic apparatus may include a projection-type head up display (HUD), a direct-view-type head mounted display (HMD), a personal computer, a digital still camera, a liquid crystal television, and the like.

Note that the present disclosure is not limited to the embodiments described above, and various modifications and improvements can be added to the above-described embodiments. Modified examples will be described below.

Modified Example 1

Figure 19:
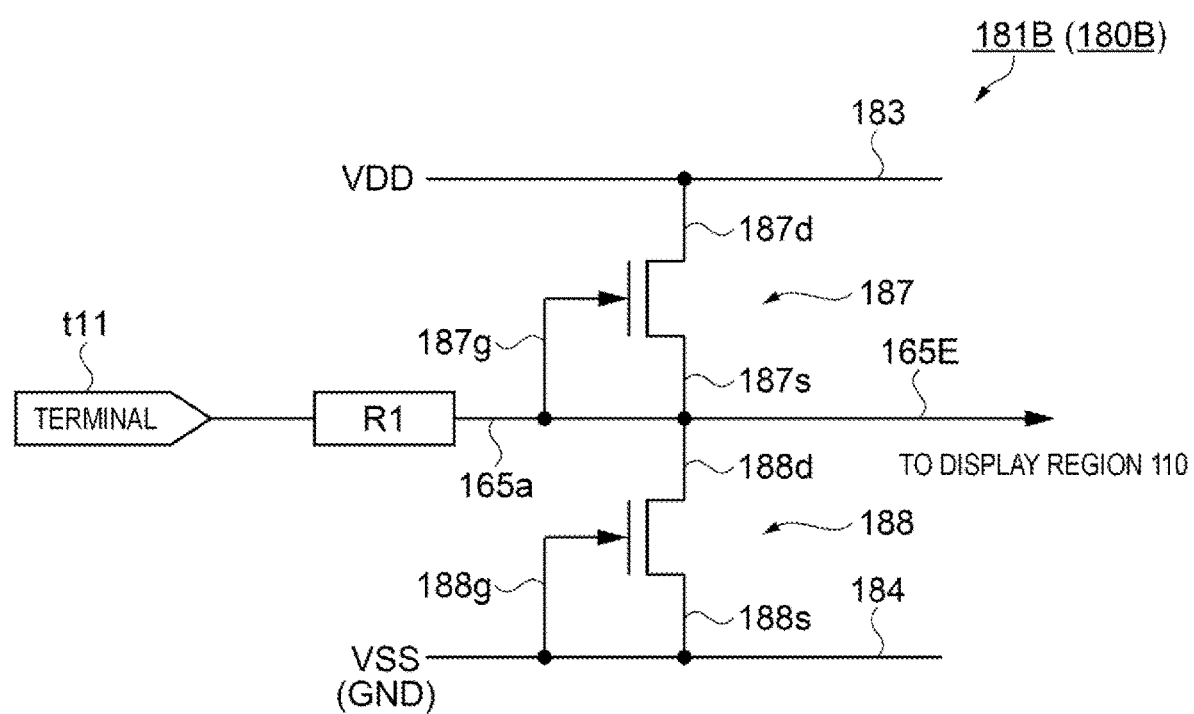
FIG. 19 is a circuit diagram illustrating a first electrostatic protection circuit according to a modified example.

The electrical configuration of the electrostatic protection circuit 180 (the first electrostatic protection circuit 181 and the second electrostatic protection circuit 182) is not limited to including the P-type transistor 185 and the N-type transistor 186. FIG. 19 is a circuit diagram illustrating an electrical configuration of a first electrostatic protection circuit of a modified example. Specifically, this is a modified example of Example 5. As illustrated in FIG. 19, a first electrostatic protection circuit 181B (an electrostatic protection circuit 180B) of the modified example is configured to include the resistive element R1 and two N-type transistors 187 and 188. One end of the resistive element R1 is electrically coupled to the terminal t11 as the first terminal of the first terminal group 161, and the other end of the resistive element R1 is electrically coupled to the first portion 165a of the first video signal line 165E. The one N-type transistor 187 is provided between the power source wiring 183, to which VDD is supplied, and the first portion 165a. A drain electrode 187d of the N-type transistor 187 is electrically coupled to the power source 183, and a gate electrode 187g and a source electrode 187s are electrically coupled to the first portion 165a. The other N-type transistor 188 is provided between the power source wiring 184, to which VSS (GND) is supplied, and the first portion 165a. A drain electrode 188d of the N-type transistor 188 is electrically coupled to the first portion 165a, and a gate electrode 188g and a source electrode 188s are electrically coupled to the power source wiring line 184. Positive potential static electricity entering the terminal t11 is grounded to the power source wiring line 183 via the N-type transistor 187, after being attenuated by the resistive element R1. Negative potential static electricity entering the terminal t11 is grounded to the power source wiring line 184 via the N-type transistor 188, after being attenuated by the resistive element R1. Note that such a configuration of the first electrostatic protection circuit 181B can also be applied to the second electrostatic protection circuit 182. Further, the number of transistors configuring the electrostatic protection circuit is not limited to two, and the electrostatic protection circuit may be configured using four transistors, for example. In addition, with respect to the resistive element R1, a configuration may be adopted in which the resistive element is provided not only between the terminal t11 and the first portion 165a, but also between the second portion 163b and the third portion 163c of the first video signal line 163, for example.

Modified Example 2

From the viewpoint of making the electrical properties (the electrical resistance, the wiring capacity (the wiring time constant)) of the first video signal line coupled to the first terminal of the first terminal group 161 and the second video signal line coupled to the second terminal of the second terminal group 162 the same, the first terminal group 161 and the second terminal group 162 are preferably disposed so as to be side-by-side in the Y direction in the terminal portion 105, but the arrangement of the first terminal group 161 and the second terminal group 162 is not limited thereto. For example, in the arrangement of the first video signal line 163 and the second video signal line 164 illustrated in Example 1, the length of the second portion 163b of the first video signal line 163 and the length of the fifth portion 164b of the second video signal line 164 can be made the same by disposing the second terminal group 162 so as to be offset, in the negative X direction, with respect to the first terminal group 161. Note that, in Example 1, even if the position of the fourth portion 164a of the second video signal line 164 coupled to the second terminal of the second terminal group 162 is offset in the negative X direction while keeping the relative positions of the first terminal group 161 and the second terminal group 162 the same, similarly to Modified Example 2 described above, the lengths of the second portion 163b of the first video signal line 163 and the first portion 164b of the second video signal line 164 can be made the same.

Modified Example 3

The electro-optical device to which the present disclosure is applied is not limited to the light-transmitting liquid crystal device described in the first embodiment or the second embodiment, but is also applicable to a reflective liquid crystal device. Furthermore, the present invention is not limited to a light receiving liquid crystal device, and, for example, can be applied to a light emitting device provided with a light emitting element such as an organic EL element.

Contents derived from the embodiments are described below.

The electro-optical device according to the present application includes a display region, a first terminal group including a first terminal, a second terminal group including a second terminal disposed on an opposite side of the display region from the first terminal, a first video signal line electrically coupled to the first terminal and a second video signal line electrically coupled to the second terminal. The first video signal line includes a first portion extending from the first terminal toward the second terminal group, a second portion extending from the first portion in a direction intersecting the first portion, and a third portion extending from the second portion toward the display region, and the second video signal line includes a fourth portion extending from the second terminal toward the first terminal group, a fifth portion extending from the fourth portion along the second portion of the first video signal line, and a sixth portion extending from the fifth portion toward the display region along the third portion of the first video signal line.

According to the configuration of the present application, a length in the extending direction of the fifth portion, which extends along the second portion of the first video signal line, is substantially the same as that of the second portion. Further, the first portion of the first video signal line and the fourth portion of the second video signal line extend so as to face each other between the first terminal group and the second terminal group, and the sixth portion of the second video signal line extends along the third portion of the first video signal line in the same direction as the third portion. Thus, the first portion and the fourth portion, and the third portion and the sixth portion can have the same specification, respectively, in terms of design. In other words, it is possible to reduce differences in the electrical properties of the first video signal line and the second video signal line in a region in which the first terminal group and the second terminal group are arranged, and it is also possible to obtain a simple configuration in the design of both the video signal lines. Specifically, the electro-optical device can be provided that includes the first video signal line and the second video signal line having the simple configuration in terms of design, while suppressing a deterioration in display quality resulting from differences in the electrical properties of the first video signal line coupled to the first terminal of the first terminal group and the second video signal line coupled to the second terminal of the second terminal group.

Further, another electro-optical device according to the present application includes a display region, a first terminal group including a first terminal, a second terminal group including a second terminal disposed on an opposite side of the display region from the first terminal, a first video signal line electrically coupled to the first terminal, and a second video signal line electrically coupled to the second terminal. The first video signal line includes a first portion extending from the first terminal toward the second terminal group, a second portion extending from the first portion in a direction intersecting the first portion, and a third portion extending from the second portion toward the display region, and the second video signal line includes a fourth portion extending from the second terminal toward the first terminal group, a fifth portion extending from the fourth portion in an opposite direction to the second portion of the first video signal line, and a sixth portion extending from the fifth portion toward the display region along the third portion of the first video signal line.

According to the configuration of the other electro-optical device of the present application, the first portion of the first video signal line and the fourth portion of the second video signal line extend so as to face each other between the first terminal group and the second terminal group, and the sixth portion of the second video signal line extends along the third portion of the first video signal line in the same direction as the third portion. Further, the fifth portion of the second video signal line extends in the opposite direction to the second portion of the first video signal line, and thus, the first portion and the fourth portion, the second portion and the fifth portion, and the third portion and the sixth portion can have the same specification, respectively, in terms of design. In other words, it is possible to substantially eliminate differences in the electrical properties of the first video signal line and the second video signal line in the region in which the first terminal group and the second terminal group are arranged, and it is also possible to obtain a simple configuration in the design of both the video signal lines. Specifically, the electro-optical device can be provided that includes the first video signal line and the second video signal line having the simple configuration in terms of design, while suppressing a deterioration in display quality resulting from differences in the electrical properties of the first video signal line coupled to the first terminal of the first terminal group and the second video signal line coupled to the second terminal of the second terminal group.

In the electro-optical device described above, the third portion of the first video signal line and the sixth portion of the second video signal line are preferably disposed between the first terminal of the first terminal group and another terminal adjacent to the first terminal.

According to this configuration, the third portion of the first video signal line and the sixth portion of the second video signal line each extending toward the display region can be arranged parallel to each other between the first terminal and the other terminal adjacent to the first terminal. Accordingly, it is possible to reduce differences between a wiring capacity of the first video signal line and a wiring capacity of the second video signal line. In other words, it is possible to reduce a difference in a wiring time constant. Specifically, it is possible to suppress a deterioration in display quality caused by the difference in the wiring time constant between the first video signal line and the second video signal line.

In the electro-optical device described above, the third portion of the first video signal line preferably extends along one side of the first terminal, and the sixth portion of the second video signal line is preferably disposed along another side of the first terminal opposite to the one side.

According to this configuration, the third portion of the first video signal line and the sixth portion of the second video signal line each extending toward the display region are arranged in parallel with each other on either side of the first terminal. Accordingly, it is possible to reduce differences between the wiring capacity of the first video signal line and the wiring capacity of the second video signal line. In other words, it is possible to reduce the difference in the wiring time constant. Specifically, it is possible to suppress a deterioration in the display quality caused by the difference in the wiring time constant between the first video signal line and the second video signal line.

The electro-optical device described above preferably further includes a first extending portion extending from the third portion of the first video signal line to a side opposite to the display region, and a second extending portion extending from the sixth portion of the second video signal line to the side opposite to the display region.

According to this configuration, a wiring capacity of the portion over which the first extending portion is added to the third portion of the first video signal line, and a wiring capacity of the portion over which the second extending portion is added to the sixth portion of the second video signal line becomes the same. Accordingly, the wiring time constant of the first video signal line, and the wiring time constant of the second video signal line can be made the same. Specifically, it is possible to inhibit a deterioration in the display quality caused by the difference in the wiring time constant between the first video signal line and the second video signal line.

The electro-optical device described above preferably further includes a first electrostatic protection circuit electrically coupled to the first portion of the first video signal line, and a second electrostatic protection circuit electrically coupled to the fourth portion of the second video signal line.

According to this configuration, by providing the first electrostatic protection circuit and the second electrostatic protection circuit, it is possible to inhibit damage to the first video signal line and the second video signal line as a result of static electricity entering into each of the first terminal and the second terminal, and to provide the electro-optical device having resistance to static electricity. Further, since the first electrostatic protection circuit and the second electrostatic protection circuit are arranged between the first terminal group and the second terminal group, in comparison to a case in which the first electrostatic protection circuit is arranged between the first terminal group and the display region, space saving can be achieved for a terminal portion on which the first terminal group and the second terminal group are arranged.

An electronic apparatus according to the present application includes the electro-optical device described above.

According to the configuration of the present application, it is possible to provide the electronic apparatus capable of a good appearance display, by being provided with the electro-optical device that suppresses a deterioration in the display quality caused by differences in electrical properties between the first video signal line and the second video signal line.

What is claimed is:

1. An electro-optical device comprising:
a display region;
a first terminal group including a first terminal;
a second terminal group including a second terminal disposed on an opposite side of the display region from the first terminal;
a first video signal line electrically connected to the first terminal; and
a second video signal line electrically connected to the second terminal, wherein
the first video signal line includes a first portion extending from the first terminal toward the second terminal group, a second portion extending from the first portion in a direction intersecting the first portion, and a third portion extending from the second portion toward the display region,
the second video signal line includes a fourth portion extending from the second terminal toward the first terminal group, a fifth portion extending from the fourth portion along the second portion of the first video signal line, and a sixth portion extending from the fifth portion toward the display region along the third portion of the first video signal line,
the third portion of the first video signal line extends along one side of the first terminal, and the sixth portion of the second video signal line is disposed along another side of the first terminal opposite to the one side, and
the electro-optical device further comprises:
a first extending portion extending from the third portion of the first video signal line to a side opposite to the display region; and
a second extending portion extending from the sixth portion of the second video signal line to the side opposite to the display region.

2. An electro-optical device comprising:
a display region;
a first terminal group including a first terminal;

a second terminal group including a second terminal disposed on an opposite side of the display region from the first terminal;

a first video signal line electrically connected to the first terminal; and a second video signal line electrically connected to the second terminal, wherein the first video signal line includes a first portion extending from the first terminal toward the second terminal group, a second portion extending from the first portion in a direction intersecting the first portion, and a third portion extending from the second portion toward the display region, the second video signal line includes a fourth portion extending from the second terminal toward the first terminal group, a fifth portion extending from the fourth portion, in a direction opposite to the second portion of the first video signal line, and a sixth portion extending from the fifth portion toward the display region along the third portion of the first video signal line, the third portion of the first video signal line extends along one side of the first terminal, and the sixth portion of the second video signal line is disposed along another side of the first terminal opposite to the one side, and the electro-optical device further comprises:

a first extending portion extending from the third portion of the first video signal line to a side opposite to the display region; and a second extending portion extending from the sixth portion of the second video signal line to the side opposite to the display region.

3. The electro-optical device according to claim 1, wherein the third portion of the first video signal line and the sixth portion of the second video signal line are disposed between the first terminal of the first terminal group and another terminal adjacent to the first terminal.

4. The electro optical device according to claim 1, comprising:

a first electrostatic protection circuit electrically connected to the first portion of the first video signal line; and a second electrostatic protection circuit electrically connected to the fourth portion of the second video signal line.

5. An electronic apparatus comprising:

the electro-optical device according to claim 1.

6. An electro-optical device comprising:

a display region;

a first terminal group including a first terminal;

a second terminal group including a second terminal disposed on an opposite side of the display region from the first terminal;

a first video signal line electrically connected to the first terminal; and a second video signal line electrically connected to the second terminal, wherein the first video signal line includes a first portion extending from the first terminal toward the second terminal group, a second portion extending from the first portion in a direction intersecting the first portion, and a third portion extending from the second portion toward the display region, the second video signal line includes a fourth portion extending from the second terminal toward the first terminal group, a fifth portion extending from the fourth portion, in a direction opposite to the second portion of the first video signal line, and a sixth portion extending from the fifth portion toward the display region along the third portion of the first video signal line, and the electro-optical device further comprises:

a first electrostatic protection circuit electrically connected to the first portion of the first video signal line; and a second electrostatic protection circuit electrically connected to the fourth portion of the second video signal line.

* * * * *